United States Patent
Grotjohn et al.

(10) Patent No.: US 12,098,475 B2
(45) Date of Patent: Sep. 24, 2024

(54) METHODS FOR FORMING LARGE AREA SINGLE CRYSTAL DIAMOND SUBSTRATES WITH HIGH CRYSTALLOGRAPHIC ALIGNMENT

(71) Applicants: BOARD OF TRUSTEES OF MICHIGAN STATE UNIVERSITY, East Lansing, MI (US); Fraunhofer USA, Plymouth, MI (US)

(72) Inventors: Timothy A. Grotjohn, Okemos, MI (US); Ramon Diaz, East Lansing, MI (US); Aaron Hardy, East Lansing, MI (US)

(73) Assignees: BOARD OF TRUSTEES OF MICHIGAN STATE UNIVERSITY, East Lansing, MI (US); Fraunhofer USA, Plymouth, MI (US)

( * ) Notice: Subject to any disclaimer, the term of this patent is extended or adjusted under 35 U.S.C. 154(b) by 289 days.

(21) Appl. No.: 17/055,943

(22) PCT Filed: May 16, 2019

(86) PCT No.: PCT/US2019/032602
§ 371 (c)(1),
(2) Date: Nov. 16, 2020

(87) PCT Pub. No.: WO2019/222458
PCT Pub. Date: Nov. 21, 2019

(65) Prior Publication Data
US 2021/0214856 A1 Jul. 15, 2021

Related U.S. Application Data

(60) Provisional application No. 62/673,420, filed on May 18, 2018.

(51) Int. Cl.
*C30B 25/20* (2006.01)
*C30B 25/02* (2006.01)
(Continued)

(52) U.S. Cl.
CPC ............ *C30B 25/025* (2013.01); *C30B 25/04* (2013.01); *C30B 25/08* (2013.01); *C30B 25/12* (2013.01);
(Continued)

(58) Field of Classification Search
CPC ....... C30B 25/00; C30B 25/02; C30B 25/025; C30B 25/04; C30B 25/08; C30B 25/12;
(Continued)

(56) References Cited

U.S. PATENT DOCUMENTS

| 5,127,983 | A | * | 7/1992 | Imai | ........................ C30B 29/04 501/86 |
| 5,311,103 | A | | 5/1994 | Asmussen et al. | |

(Continued)

FOREIGN PATENT DOCUMENTS

| EP | 0 573 943 A1 | 12/1993 |
| EP | 1553215 A2 | 7/2005 |

(Continued)

OTHER PUBLICATIONS

European Patent Application No. 19804078.4, Extended European Search Report, dated Jan. 25, 2022.

(Continued)

*Primary Examiner* — Kenneth A Bratland, Jr.
(74) *Attorney, Agent, or Firm* — MARSHALL, GERSTEIN & BORUN LLP

(57) ABSTRACT

The disclosure relates to large area single crystal diamond (SCD) surfaces and substrates, and their methods of formation. Typical large area substrates can be at least about 25 mm, 50 mm, or 100 mm in diameter or square edge length, (Continued)

and suitable thicknesses can be about 100 μm to 1000 μm. The large area substrates have a high degree of crystallographic alignment. The large area substrates can be used in a variety of electronics and/or optics applications. Methods of forming the large area substrates generally include lateral and vertical growth of SCD on spaced apart and crystallographically aligned SCD seed substrates, with the individual SCD growth layers eventually merging to form a composite SCD layer of high quality and high crystallographic alignment. A diamond substrate holder can be used to crystallographically align the SCD seed substrates and reduce the effect of thermal stress on the formed SCD layers.

29 Claims, 14 Drawing Sheets

(51) Int. Cl.
C30B 25/04 (2006.01)
C30B 25/08 (2006.01)
C30B 25/12 (2006.01)
C30B 25/16 (2006.01)
C30B 29/04 (2006.01)
C30B 29/68 (2006.01)

(52) U.S. Cl.
CPC ............... *C30B 25/16* (2013.01); *C30B 25/20* (2013.01); *C30B 29/04* (2013.01); *C30B 29/68* (2013.01)

(58) Field of Classification Search
CPC ......... C30B 25/16; C30B 25/18; C30B 25/20; C30B 29/00; C30B 29/02; C30B 29/04; C30B 29/68; C23C 16/22; C23C 16/26; C23C 16/27; C23C 16/274
USPC ................ 117/84, 88–89, 94, 101, 105–106, 117/928–929
See application file for complete search history.

(56) References Cited

U.S. PATENT DOCUMENTS

| | | | |
|---|---|---|---|
| 5,443,032 A * | 8/1995 | Vichr | C30B 29/40 423/446 |
| 5,733,369 A | 3/1998 | Yonehara et al. | |
| 7,390,695 B2 * | 6/2008 | Meguro | H01L 21/02645 257/E21.123 |
| 8,316,797 B2 | 11/2012 | Asmussen et al. | |
| 8,668,962 B2 | 3/2014 | Asmussen et al. | |
| 9,637,838 B2 | 5/2017 | Coe et al. | |
| 2005/0160968 A1 * | 7/2005 | Meguro | C23C 16/279 117/68 |
| 2007/0034147 A1 * | 2/2007 | Wort | C30B 23/02 117/200 |
| 2010/0034984 A1 | 2/2010 | Asmussen et al. | |
| 2010/0166636 A1 | 7/2010 | Yamada et al. | |
| 2013/0272928 A1 * | 10/2013 | Misra | H01J 37/32192 422/186 |

FOREIGN PATENT DOCUMENTS

| | | |
|---|---|---|
| JP | 2012-092018 A | 5/2012 |
| JP | 2012-111653 A | 6/2012 |
| WO | WO-2012/158532 A1 | 11/2012 |

OTHER PUBLICATIONS

Findeling-Dufour et al., Growth of large single-crystal diamond layers: analysis of the junctions between adjacent diamonds, Diamond and Related Materials, 7(7):986-98 (1998).
Janssen et al., 'Mosaic' growth of diamond, Diamond and Related Methods, 4(7):1025-31 (1995).
Posthill et al., Demonstration of a method to fabricate a large-area diamond single crystal, Thin Solid Films, 271(1):39-49 (1995).
Mokuno Y. et al., "Synthesizing Single-Crystal Diamond by Reprtition of High Rate Homoepitaxial Grouth by Microwave Plasma CVD", *Diamond Relat. Matter.*, 14:1743-46 (2005).
International Application No. PCT/US2019/032602, International Search Report and Written Opinion, mailed Jul. 22, 2019.
Tallaire A. et al., "Reduction of Dislocations in Single Crystal Diamond by Lateral Growth over a Macroscopic Hole", *Adv. Mater.*, 1604823, 5 pages (2017).

* cited by examiner (a)

(b)

(c)

(a)                                (b)

(a)                                (b)

METHODS FOR FORMING LARGE AREA SINGLE CRYSTAL DIAMOND SUBSTRATES WITH HIGH CRYSTALLOGRAPHIC ALIGNMENT

CROSS-REFERENCE TO RELATED APPLICATIONS

This is a National Stage of International Application No. PCT/US2019/032602, filed May 16, 2019, which claims the benefit of U.S. Provisional Application No. 62/673,420 (filed May 18, 2018), which is are incorporated herein by reference in their entireties.

STATEMENT OF GOVERNMENT INTEREST

This invention was made with government support under FA8721-05-C-0002 awarded by the U.S. Air Force Office of Scientific Research and DE-AR0000455 awarded by the Department of Energy. The government has certain rights in the invention.

FIELD OF THE DISCLOSURE

The disclosure relates to large area single crystal diamond (SCD) surfaces and substrates, and their methods of formation. Typical large area substrates can be at least about 25 mm, 50 mm, or 100 mm in diameter or square edge length, and suitable thicknesses can be about 100 μm to 1000 μm. The large area substrates have a high degree of crystallographic alignment. The large area substrates can be used in a variety of electronics and/or optics applications.

BACKGROUND OF THE DISCLOSURE

Diamond has been renowned for its material properties since the fourth century BC. Most commonly known for its refractive properties and hardness, diamond also has other favorable properties which include its thermal conductivity, high electrical resistance, wide electrical bandgap, and thermal stability.

Diamond has been highly desired in electronics because of its thermal conductivity. Synthetic diamond enriched in $^{12}C$ (99.9%) has the highest thermal conductivity of any solid at room temperature (33 W/cm K), 8 times that of copper. Natural isotopic diamond has a thermal conductivity of 22 W/cm K. Diamond is also an electrical insulator (high electrical resistance). Because of these two properties, electronic manufacturers have used diamond on a limited basis for its uncommon ability to remove heat without conducting electricity.

Diamond has also had considerable interest as a semiconductor. Though natural diamond is an electrical insulator, synthetic diamond can be p and n doped to create a wide bandgap semiconductor. Wide bandgap semiconductors have improved capabilities in power electronics in fields that require high-power electronics, high temperature, and/or high voltage. Examples include renewable energy systems, transportation electrical systems and transmission/distribution grid systems. As a wide bandgap semiconductor, diamond has material properties that exceed other wide bandgap semiconductors and commercial silicon (Si) semiconductors. In particular diamond has a larger bandgap, higher electric field breakdown strength, higher carrier mobility, and higher thermal conductivity than all other semiconductors. Diamond-based power electronic devices will enable high-voltage and high-current switching with greater efficiency and speed, while reliable operating at higher temperatures with simpler cooling systems.

A limiting technical challenge to these technologies is the need for high quality larger single crystal diamond substrates. Current substrate sizes are below about 0.25 $in^2$ (about 160 $mm^2$) while the desired substrate size is about 4 $in^2$ (about 2500 $mm^2$) or larger. The 4 $in^2$ minimum is key to moving diamond into microfabrication cleanrooms and enabling diamond to be a drop-in replacement for similarly sized silicon substrates.

SUMMARY

The disclosure relates to large area single crystal diamond (SCD) surfaces and substrates, and their methods of formation. The disclosure more specifically relates to creation and replication processes for making about 1 $in^2$ (about 625 $mm^2$), 4 $in^2$ (about 2500 $mm^2$), 16 $in^2$ (about 10000 $mm^2$) or larger high quality single crystal diamond substrates. This method generally utilizes single crystal diamond (SCD) seed substrates separately seated and spaced apart in a diamond substrate holder, such as a polycrystalline diamond (PCD) or a highly ordered diamond (HOD) wafer. The seeds are then grown through chemical vapor deposition (CVD) techniques to encourage SCD growth in the lateral direction on the seed substrates until the growth from the single crystal seeds coalesces with the growth from the surrounding crystal seeds.

The method involves lateral SCD overgrowth to expand surface area while maintaining high crystalline quality and alignment throughout the enlarged single substrate. The SCD seed substrates are first seated into the diamond substrate holder such that their top (deposition or growth) surfaces slightly above the top surface of the diamond substrate holder (e.g., a PCD or HOD surface). Metal masking layers can be deposited on the top surface of the diamond substrate holder (e.g., a HOD surface) immediately adjacent to the SCD seed substrates. This allows for growth in the lateral direction when diamond nucleation and deposition on the surface of the metal is reduced or prevented. In other embodiments, no metal masking layer is deposited on the diamond substrate holder, for example when it is a PCD substrate holder that will exhibit reduced diamond deposition given the axial spatial separation between top SCD seed substrate surface and the top PCD substrate holder surface. This deposition process is continued until all the individual, separate SCD lateral overgrowth structures (or "islands") coalesce with each other. The single composite SCD layer can be cut into smaller SCD substrates, which can in turn be used as the SCD seed substrates for another method cycle to increase substrate area again. Once the overgrowth cycles complete, the final, large area SCD substrate wafer preferably has a large-face surface area of about 1 $in^2$ (about 625 $mm^2$), 4 $in^2$ (about 2500 $mm^2$), 16 $in^2$ (about 10000 $mm^2$) or larger for further use in downstream electronics and/or optics manufacturing processes. This large area SCD substrate wafer can be referred to as a "master wafer" and may be used to produce further large area SCD substrate wafers having the same size and high crystallographic quality and alignment.

Example 1 below illustrates the disclosed method, demonstrating the lateral SCD overgrowth and eventual joining or coalescence of SCD from two SCD seed substrates into a single composite SCD layer of increased surface area relative to the combined surface area of the original two SCD seed substrates. The single composite SCD layer formed would be suitable for cutting into a plurality of smaller SCD substrates, which could be used as seed substrates for second and subsequent applications of the disclosed method for yet further increase in net surface SCD surface area. In an illustrative application of one lateral overgrowth and joining cycle of the disclosed method, two 3.5 mm (L)×1.75 mm (W) SCD substrates (1.4 mm thick) were grown and joined to form a single, larger area composite SCD layer with dimensions of about 4.08 mm (L)× 3.85 mm (W), for a surface area increase of about 28% (i.e., a ratio of final:initial surface area of about 1.28).

In one aspect, the disclosure relates to a method for forming a composite SCD layer or a large area single crystal diamond (SCD) surface or substrate, the method comprising: (a) providing a first SCD substrate having a growth surface; (b) providing a second SCD substrate having a growth surface, the second SCD substrate being spaced apart from and crystallographically aligned with the first SCD substrate (e.g., within 1° or less, such as at least 0.001°, 0.01°, 0.02° or 0.05° and/or up to 0.1°, 0.2°, 0.3°, 0.4°, 0.5°, 0.6°, 0.7°, 0.8°, 0.9°, or 1°); (c) depositing a first SCD layer on the first SCD growth surface and a second SCD layer on the second SCD growth surface, the layers extending both vertically and laterally relative to their respective growth surfaces; and (d) continuing deposition of the first SCD layer and the second SCD layer at least until they join together to form a composite (or single) SCD layer.

Various refinements of the method and corresponding structures are possible.

In a refinement, the method further comprises (e) cutting and optionally polishing the composite SCD layer to form a large area SCD substrate therefrom. In a further refinement, the large area SCD substrate has a thickness in a range of 0.1 mm to 5 mm. In a further refinement, the method further comprises (f) cutting and optionally polishing the large area SCD substrate into a plurality of smaller SCD substrates each having a growth surface. In a further refinement, the method further comprises repeating steps (a)-(d) (e.g., and optionally (e) and (f)) with at least two of the smaller SCD substrates as the first SCD substrate and the second SCD substrate.

In another refinement, providing the first SCD substrate and providing the second SCD substrate comprises: providing a diamond substrate holder comprising (i) a first recess sized and shaped to receive the first SCD substrate and (ii) a second recess sized and shaped to receive the second SCD substrate, wherein the first recess and the second recess are spaced apart and positioned relative to each other such that the first SCD substrate and the second SCD substrate are crystallographically aligned when placed in their respective recesses; and placing the first SCD substrate in the first recess such that the first SCD substrate growth surface is at or (preferably) above a surrounding top surface of the diamond substrate holder; and placing the second SCD substrate in the second recess such that the second SCD substrate growth surface is at or (preferably) above a surrounding top surface of the diamond substrate holder. In a further refinement, the diamond substrate holder is formed from highly ordered diamond (HOD) or SCD; and the surrounding top surface of the diamond substrate holder further comprises a metal masking layer thereon. In a further refinement, the diamond substrate holder is formed from polycrystalline diamond (PCD).

In another refinement, the growth surface of the first SCD substrate is a (100) crystallographic surface; and the growth surface of the second SCD substrate is a (100) crystallographic surface.

In another refinement, the first SCD substrate and the second SCD substrate are spaced apart by a distance of 0.5 mm to 5 mm. In a further refinement, the (spacing) distance is a normal distance between an edge or (generally vertical) sidewall of the first SCD substrate and a corresponding (or closest) edge or (generally vertical) sidewall of the second SCD substrate. In a further refinement, the edge or sidewall of the first SCD substrate is crystallographically complementary to the corresponding edge or sidewall of the second SCD substrate. In a further refinement, providing the first SCD substrate and providing a second SCD substrate comprises: cutting a master SCD substrate along a cutting surface (or plane) to form the first SCD substrate and the second SCD substrate as separate structures; and aligning the first SCD substrate and the second SCD substrate such that the edge or sidewall of the first SCD substrate and the edge or sidewall of the second SCD substrate both correspond to the cutting surface from the master SCD substrate.

In another refinement, the first SCD substrate and the second SCD substrate each independently have: a growth surface area in a range of 1 mm$^2$ to 625 mm$^2$; and a thickness in a range of 0.1 mm to 5 mm.

In another refinement, depositing the first SCD layer and the second SCD layer comprises performing a chemical vapor deposition (CVD) process (e.g., microwave plasma-assisted CVD or otherwise). In a further refinement, performing the CVD process comprises: operating a microwave plasma-assisted reactor in combination with a deposition source gas at a temperature and pressure sufficient to deposit the first SCD layer and the second SCD layer.

In another refinement, the first SCD layer and the second SCD layer grow freely in an open growth volume and not in contact with a support surface.

In another refinement, the first SCD layer and the second SCD layer have a vertical growth rate in a range of 1 μm/h to 100 μm/h.

In another refinement, the first SCD layer and the second SCD layer have a lateral growth rate in a range of 1 μm/h to 100 μm/h.

In another refinement, the first SCD layer and the second SCD layer have a ratio of vertical growth rate:lateral growth rate in a range of 0.1 to 10.

In another refinement, the composite SCD layer has a thickness in a range of 0.1 mm to 5 mm.

In another refinement, the composite SCD layer has a top surface area that is at least 1.1 times the combined surface area of the first SCD substrate growth surface and the second SCD substrate growth surface.

In another refinement, the composite SCD layer and/or the large area SCD substrate has a crystallographic alignment of 1° or less.

In another aspect, the disclosure relates to a large area single crystal diamond (SCD) substrate formed according to any of the variously disclosed embodiments. In a refinement, the large area SCD substrate has a (top or upper) surface area of at least 500 mm$^2$. In a refinement, the large area SCD substrate has a crystallographic alignment of 1° or less.

In another aspect, the disclosure relates to a large area single crystal diamond (SCD) substrate comprising: an SCD body having a surface area of at least 500 mm$^2$ and a crystallographic alignment of 0.4° or less. In a refinement, the SCD body has a thickness in a range of 0.1 mm to 5 mm.

In another aspect, the disclosure relates to a method of duplicating a large area single crystal diamond (SCD) substrate, the method comprising: providing a large area SCD substrate according to any of the variously disclosed embodiments; depositing an SCD layer on a surface of the large area SCD substrate; and optionally removing the SCD layer (e.g., via cutting and/or polishing) to form a duplicate large area SCD substrate.

While the disclosed apparatus, systems, processes, methods, and compositions are susceptible of embodiments in various forms, specific embodiments of the disclosure are illustrated (and will hereafter be described) with the understanding that the disclosure is intended to be illustrative, and is not intended to limit the claims to the specific embodiments described and illustrated herein.

BRIEF DESCRIPTION OF THE DRAWINGS

For a more complete understanding of the disclosure, reference should be made to the following detailed description and accompanying drawings wherein.

DETAILED DESCRIPTION

The disclosure relates to large area single crystal diamond (SCD) surfaces and substrates, and their methods of formation. Typical large area substrates can be at least about 25 mm, 50 mm, or 100 mm in diameter or square edge length, and suitable thicknesses can be about 100 μm to 1000 μm. The large area substrates have a high degree of crystallographic alignment. The large area substrates can be used in a variety of electronics and/or optics applications. Methods of forming the large area substrates generally include lateral and vertical growth of SCD on spaced apart and crystallographically aligned SCD seed substrates, with the individual SCD growth layers eventually merging to form a composite SCD layer of high quality and high crystallographic alignment. A diamond substrate holder can be used to crystallographically align the SCD seed substrates and reduce the effect of thermal stress on the formed SCD layers.

FIGS. 1A-1G illustrate various structures, components, and steps for forming a large area SCD surface or substrate 163L according to the disclosure.

Figure 1A:
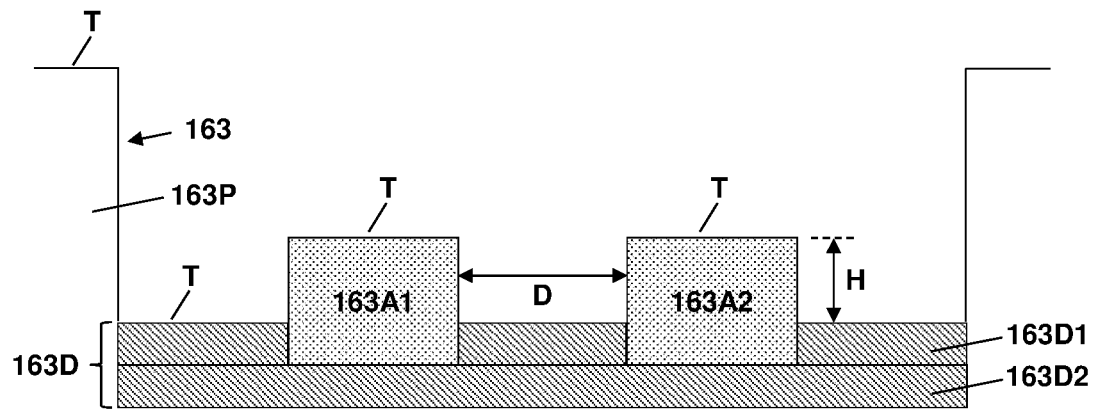
FIG. 1A is a cross-sectional view of SCD substrates in a diamond substrate holder and prior to SCD deposition according to the disclosure.

FIG. 1A illustrates an initial step in a method for forming a composite (or single) SCD layer 163C, which in turn can be cut and/or polished to form the large area SCD surface or substrate 163L. FIG. 1A is cross-sectional view of showing first and second SCD substrates 163A1, 163A2 in a diamond substrate holder 163D and prior to SCD deposition according to the disclosure. Each SCD substrate 163A1, 163A2 has a corresponding growth surface where further SCD is to be deposited, for example top surface T as illustrated (e.g., where top is a relative upper position as the substrates 163A1, 163A2 are orientated or placed in the substrate holder 163D and/or in a deposition reactor 100). The substrates 163A1, 163A2 are spaced apart from each other by a distance D. The substrates 163A1, 163A2 are crystallographically aligned with each other, preferably within 1° or less, for example within a range of 0.001° to 1° (e.g., at least 0.001°, 0.01°, 0.02° or 0.05° and/or up to 0.1°, 0.2°, 0.3°, 0.4°, 0.5°, 0.6°, 0.7°, 0.8°, 0.9°, or 1°).

Diamond is a single crystal structure with atoms in a regular arrangement that exists over a long distance (e.g., generally across/through the entire diamond substrate). As used herein and as applied to two physically separate crystal structure substrates (e.g., the first and second SCD substrates), crystallographic alignment denotes that if the atomic arrangement of the first substrate were extended out beyond the actual first substrate to a location where it overlaps the second substrate, the imaginary extended first substrate atoms would be closely aligned to the atoms and their arrangement in the second substrate. Crystallographic alignment of the two separate first and second SCD substrates prior to SCD deposition and lateral growth will result in a final SCD composite layer 163C and corresponding large area SCD substrate 163L having a consistent crystallographic alignment throughout the single structure. While perfect alignment is ideal, being sufficiently close to perfect alignment can provide a suitably high quality SCD structure to serve as a master SCD substrate for further wafer production. A measure of crystallographic alignment in separate substrates can be expressed as the angle between a first direction and a second direction, where the first direction is any particular crystallographic direction in the first substrate (e.g., defined by the alignment of a row of atoms, such as the [100] direction or otherwise in the first substrate), and the second direction is the corresponding crystallographic direction in the second substrate (e.g., defined by the alignment of a corresponding row of atoms, such as the [100] direction or otherwise in the second substrate). Similarly, measure of crystallographic alignment in a single substrate as a whole can be expressed as an angle difference between maximum and minimum values for the local crystallographic orientation angles, for example as determined by XRD analysis of the substrate (e.g., determined at plurality of points spanning the large face surface area, such as at interrogation points generally corresponding to the beam width of an XRD analysis system). The crystallographic alignment angle should be small in either case, with 0° representing perfect crystallographic alignment. For example, the crystallographic alignment angle is preferably 1° or less, for example within a range of 0.001° to 1° (e.g., at least 0.001°, 0.01°, 0.02° or 0.05° and/or up to 0.1°, 0.2°, 0.3°, 0.4°, 0.5°, 0.6°, 0.7°, 0.8°, 0.9°, or 1°).

The diamond substrate holder 163D defines a first recess R1 sized and shaped to receive the first SCD substrate 163A1 and a second recess R2 sized and shaped to receive the second SCD substrate 163A2. In the illustrated embodiment, the substrate holder 163D includes an upper substrate holder plate 163D1, which defines the recesses R1, R2 as holes through the plate 163D1, and a bottom substrate holder plate 163D2, which serves as a support surface for the substrates 163A1, 163A2 seated therein. As further illustrated, the diamond substrate holder 163D and substrates 163A1, 163A2 can be seated within a larger pocket or recess of a conventional substrate holder 163P, for example formed from a metal such as molybdenum. The first and second recesses R1, R2 are spaced apart by a distance D (e.g., corresponding to the substrate separation distance) and positioned relative to each other such that the first SCD substrate 163A1 and the second SCD substrate 163A2 are crystallographically aligned when placed in their respective recesses R1, R2. The first SCD substrate 163A1 generally fits snugly in the first recess R1 such that the first SCD substrate 163A1 growth surface T is at or (preferably) above a surrounding top surface T of the diamond substrate holder 163D. Likewise, the second SCD substrate 163A2 generally fits snugly in the second recess R2 such that the second SCD substrate 163A2 growth surface T is at or (preferably) above a surrounding top surface T of the diamond substrate holder 163D. The top surfaces T of the substrates 163A1, 163A2 preferably extend above the substrate holder 163D top surface T by a height H of about 0.1 mm to 2 mm (e.g., at least 0.1, 0.2, or 0.5 mm and/or up to 0.5, 1, 1.5, or 2 mm). The greater the value of the height H, the less diamond will undesirably grow on the diamond substrate holder 163D (e.g., with or without a masking material).

The diamond substrate holder 163D is formed from diamond so that it has the same or substantially similar coefficient of thermal expansion as the SCD substrates 163A1, 163A2 therein, thus allowing the diamond substrate holder 163D, its recesses R1, R2, and the SCD substrates 163A1, 163A2 to expand/contract at substantially the same rates during a high-temperature deposition process. The diamond for the substrate holder 163D can be polycrystalline diamond (PCD), highly ordered diamond (HOD), SCD, or otherwise. The diamond substrate holder 163D is formed such that diamond deposition on the substrate holder 163D is suppressed or prevented, such as by inclusion of a metal or other masking layer and/or selection of the type of diamond (e.g., PCD to suppress SCD deposition) used to form the substrate holder 163D. Suitably, diamond deposition on the substrate holder 163D is not more than 50%, 20%, 10%, 5%, 2%, or 1% of that on the SCD substrates 163A1, 163A2, for example based on total amount (e.g., vertical height) or rate (e.g., vertical rate) of diamond deposition. The recesses R1, R2 in the substrate holder 163D can be formed with precise, desired shape, size, and relative orientation to each other by any suitable laser cutting or etching process, chemical etching process, etc., for example including a conventional computer-controlled laser cutting apparatus.

In an embodiment, the diamond substrate holder 163D is formed from highly ordered diamond (HOD) or SCD, and the surrounding top surface T of the diamond substrate holder 163D includes a metal masking layer thereon. The surrounding top surface T of the diamond substrate holder 163D can be substantially all of the top surface area around the SCD substrates 163A1, 163A2 and corresponding recesses R1, R2, or it can be just regions neighboring the SCD substrates 163A1, 163A2 and corresponding recesses R1, R2. The metal masking layer can be deposited and patterned (e.g., via masking and etching) using conventional techniques. Suitable masking metals include those that can withstand high temperature during a deposition process, such as molybdenum, iridium, etc. In an embodiment, a diamond substrate 163D to be used as the substrate holder can be processed by (i) depositing a metal masking layer on the substrate, (ii) patterning/removing the metal masking layer in areas where the recesses are to be formed, and then (iii) cutting/etching the exposed diamond substrate to form the corresponding recesses.

In another embodiment, the diamond substrate holder is formed from polycrystalline diamond (PCD). The PCD material for the substrate holder 163D itself suppresses diamond deposition and does not necessarily require a metal masking layer as described in the above embodiment. A factor in preventing too much deposition on the substrate holder 163D in either case is to maintain its temperature at a relatively low value that does not favor deposition. This can be achieved by selecting/increasing the height H as noted above.

Figure 1B:
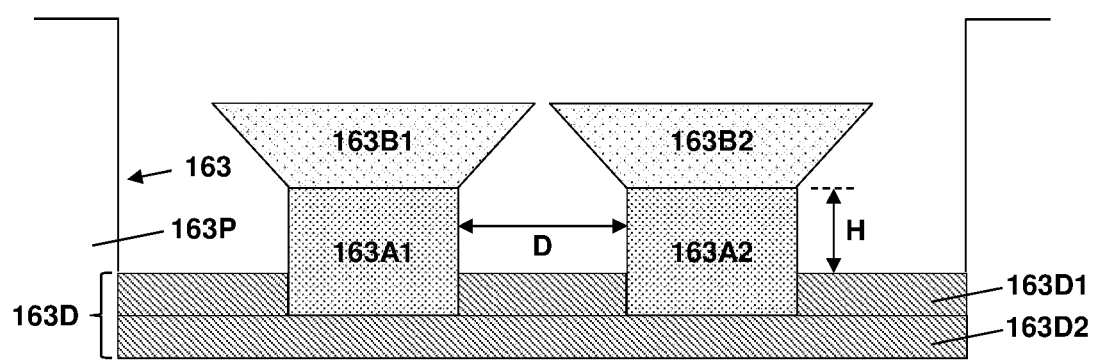
FIG. 1B is a cross-sectional view of SCD substrates in a diamond substrate holder and after SCD deposition and lateral growth according to the disclosure.
Figure 1C:
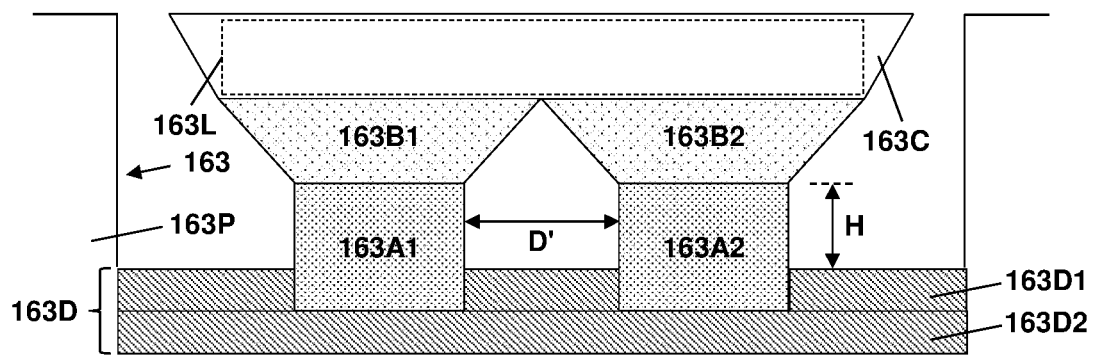
FIG. 1C is a cross-sectional view of SCD substrates in a diamond substrate holder and after SCD deposition and further lateral growth to form a composite SCD layer according to the disclosure.
Figure 1D:
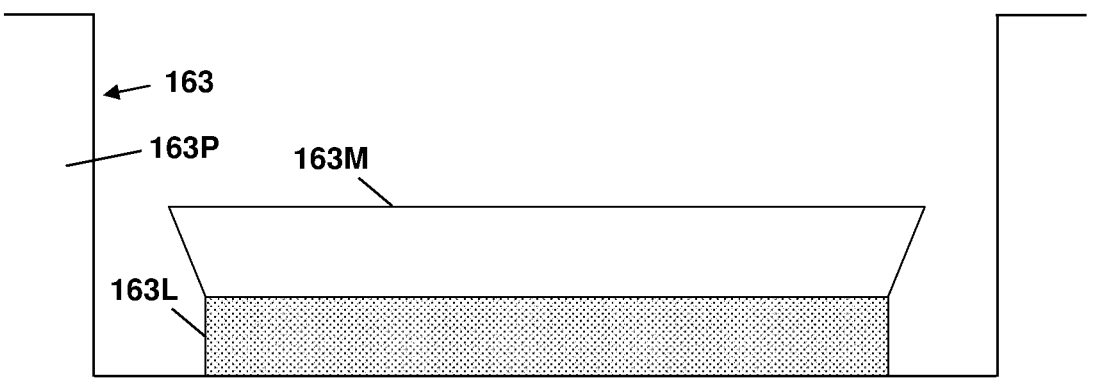
FIG. 1D is a cross-sectional view of a high quality, highly crystallographically aligned large area SCD substrate according to the disclosure used to form a duplicate high quality, highly crystallographically aligned large area SCD substrate.

In an embodiment, the top or growth surface T of the first and second SCD substrates 163A1, 163A2 are each a (100) crystallographic surface. In other embodiments, growth processes are also possible on a (110) or a (111) crystallographic surface for the substrates 163A1, 163A2. In a further embodiment, the top or growth surface T of the substrates 163A1, 163A2 can include an offcut angle $\theta_2$ of up to 10°, for example 1° to 10°. As illustrated in FIG. 1G, the offcut angle $\theta_2$ is the angle offset between the top or growth surface T of the substrates 163A1, 163A2 and the crystallographic plane T' corresponding to the growth surface T (e.g., a (100) surface for the crystallographic growth surface T and an internal (100) plane for the crystallographic plane T'). Use an offcut angle $\theta_2$ can provide higher quality diamond growth. Additionally, with an offcut angle $\theta_2$, the growth can proceed laterally at a faster rate than vertically. This may allow dislocation defects at the joining boundary to be angled towards the edges of the substrate, which would result in more defect-free large area substrate volume.

In an embodiment, the first and second SCD substrates 163A1, 163A2 (and/or the recesses R1, R2) are spaced apart by the distance D of 0.5 mm to 5 mm, for example at least 0.5, 0.7, 1, 1.2, 1.5 or 2 mm and/or up to 1, 1.5, 2, 2.5, 3, 4, or 5 mm. More specifically, the (spacing) distance is a normal distance between an edge or (generally vertical) sidewall of the first SCD substrate 163A1 and a corresponding (or closest) edge or (generally vertical) sidewall of the second SCD substrate 163A2. The corresponding edges or sidewalls are suitably substantially parallel with each other for maintaining crystallographic alignment between adjacent SCD substrates 163A1, 163A2. The edge or sidewall of the first SCD substrate 163A1 can be crystallographically complementary to the corresponding edge or sidewall of the second SCD substrate 163A2. The edges or sidewalls are crystallographically complementary if, when the first and second SCD substrates are placed in contact with each other at the edges or sidewalls, would form a continuous, crystallographically aligned SCD crystalline structure (e.g., where crystallographic complementarity is a subset of crystallographic alignment). For example, this can result when a master SCD substrate is cut into two separate smaller SCD substrates which are then used as the first and second SCD substrates 163A1, 163A2 in the deposition method, being placed such that their facing edges/sidewalls correspond to the cutting plane from the original single SCD substrate.

Figure 1E:
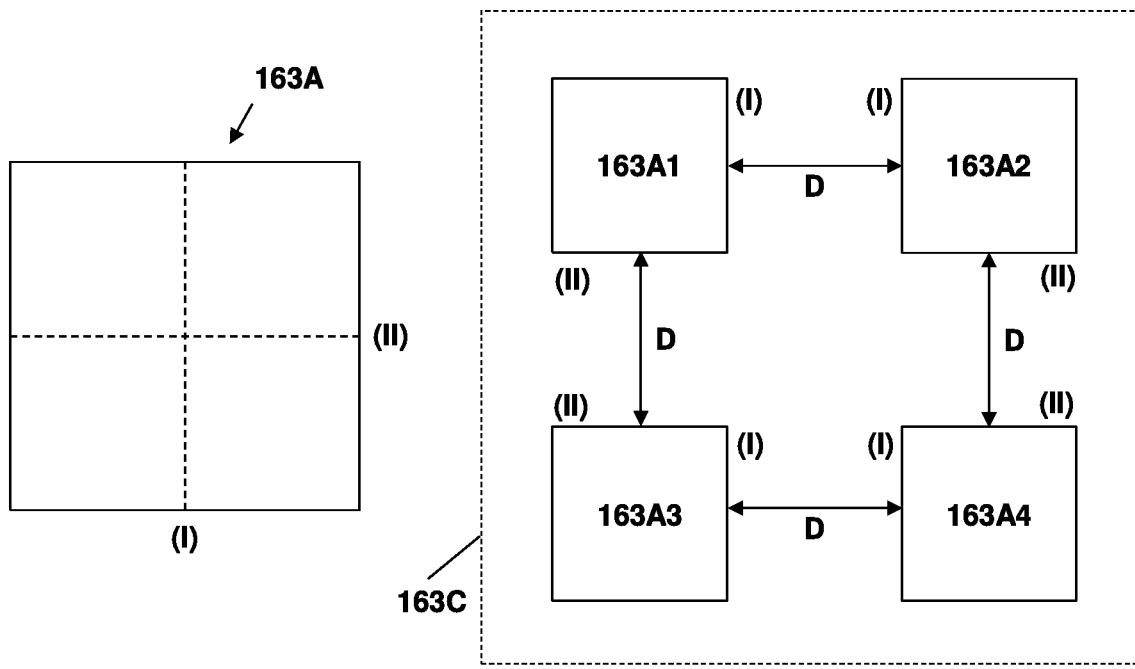
FIG. 1E is a top view of an SCD substrate that is cut into a plurality of crystallographically aligned and crystallographically complementary smaller SCD substrates that can be used as seed substrates for the disclosed method of forming a large area SCD substrate.
Figure 1F:
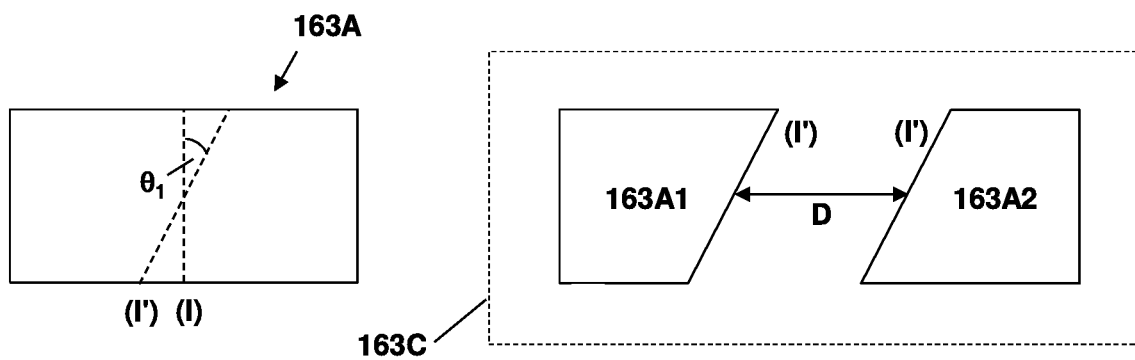
FIG. 1F is a top view of an SCD substrate that is cut into a plurality of crystallographically aligned and crystallographically complementary smaller SCD substrates along a crystalline direction offset angle.
Figure 1G:
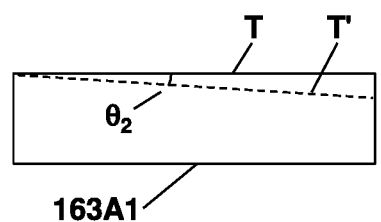
FIG. 1G is a cross-sectional view of an SCD substrate having an offcut angle relative to a crystallographic plane.

FIG. 1E illustrates an embodiment in which a master substrate 163A is cut along two cutting planes (I) and (II) form corresponding smaller first, second, third, and fourth SCD substrates 163A1, 163A2, 163A3, and 163A4 as separate structure. The resulting edges (I) and (II) corresponding to the cutting planes (I) and (II) are crystallographically complementary. The right portion of FIG. 1E illustrates how the substrates 163A1, 163A2, 163A3, and 163A4 can be aligned such that the various pairs of substrates have facing edges or sidewalls that correspond to a given common cutting plane and crystallographically complementary, further resulting in crystallographic alignment of the collective substrates (e.g., based on correspondingly precise alignment of the substrate holder recesses). For example, substrates 163A1/163A2 and 163A3/163A4 are crystallographically complementary at the edges or surfaces corresponding to cutting plane (I), and substrates 163A1/163A3 and 163A2/163A4 are crystallographically complementary at the edges or surfaces corresponding to cutting plane (II). In some embodiments, the master substrate 163A can be cut along a crystallographic direction (e.g., along a [100] direction as in Example 1 below). In another embodiment and as illustrated in FIG. 1F, the master substrate 163A can be cut at an offset angle $\theta_1$ relative to a crystallographic direction (e.g., angle offset relative to a [100] direction). Suitable values for the offset angle $\theta_1$ can be up to 30°, for example 1° or 5° to 10°, 20°, or 30°.

In an embodiment, the first and second SCD substrates 163A1, 163A2 each independently have a growth surface area in a range of 1 mm$^2$ to 625 mm$^2$, for example top and bottom surface areas of at least 1, 2, 5, 10, 20, 50, or 100 mm$^2$ and/or up to 5, 10, 15, 20, 25, 50, 75, 100, 150, 200, 300, 400, 500, or 625 mm$^2$, such as about 1 mm×1 mm, 2 mm×2 mm, 3 mm×3 mm, 4 mm×4 mm, 5 mm×5 mm, 8 mm×8 mm, 12 mm×12 mm, 20 mm×20 mm, or 25 mm×25 mm roughly square cross sections for the growth surface. Rectangular, square, or quadrilateral cross sections for the growth surface are preferable, resulting from cutting of larger area SCD substrates to form smaller area SCD substrates as the seeds for another method cycle of surface area enlargement. Further, the SCD substrates 163A1, 163A2 can have thickness in a range of 0.1 mm to 5 mm, for example at least 0.1, 0.2, 0.3, 0.5, 0.7, or 1 mm and/or up to 1, 1.5, 2, 3, 4, or 5 mm. As discussed above, the thickness values are suitable large enough that the SCD growth is preferentially on the SCD substrates 163A1, 163A2 and minimal on the surrounding diamond substrate holder 163D.

FIG. 1B illustrates a further step in the method for forming a composite SCD layer 163C or the large area SCD surface or substrate 163L. FIG. 1B is a cross-sectional view of the SCD substrates 163A1, 163A2 in the diamond substrate holder 163D and after SCD deposition and lateral growth. Relative to FIG. 1A, a first SCD layer 163B1 is deposited on the first SCD substrate 163A1 growth surface T and a second SCD layer 163B2 is deposited on the second SCD substrate 163A2 growth surface T, with the layers 163B1, 163B2 extending both vertically and laterally relative to their respective growth surfaces T. Vertical growth is generally in a direction aligned with an outwardly pointing normal vector from the growth surface T and lateral growth is generally perpendicular to and circumferential around the outwardly pointing normal vector. The resulting growth layers 163B1, 163B2 generally have outwardly and upwardly sloping sidewalls and a top surface where further SCD deposition occurs. As described below in more detail, the growth layers 163B1, 163B2 can be deposited using a chemical vapor deposition (CVD) process (e.g., microwave plasma-assisted CVD or otherwise), such as in the reactor 100. As illustrated, the first and second SCD growth layers 163B1, 163B2 can grow freely in an open growth volume without contacting with a support surface, for example a substrate holder or other substrate support surface, including a metal or other masking layer thereon. The SCD layers 163B1, 163B2 suitably grow substantially only on or in contact with their respective growth surfaces and not neighboring support surfaces or structures.

In an embodiment, the first and second SCD layers 163B1, 163B2 have a vertical growth rate in a range of 1 μm/h to 100 μm/h, for example at least 1, 2, 5 or 10 μm/h and/or up to 10, 20, 50 or 100 μm/h. The vertical growth rates for each layer can be substantially the same, but could vary locally somewhat within the reactor deposition zone.

In an embodiment, the first and second SCD layers 163B1, 163B2 have a lateral growth rate in a range of 1 μm/h to 100 μm/h, for example at least 1, 2, 5 or 10 μm/h and/or up to 10, 20, 50 or 100 μm/h. The lateral growth rates for each layer can be substantially the same, but could vary locally somewhat within the reactor deposition zone.

In an embodiment, the first and second SCD layers 163B1, 163B2 have a ratio of vertical growth rate:lateral growth rate in a range of 0.1 to 10, for example at least 0.1, 0.2, 0.5, 1, or 2 and/or up to 0.5, 1, 2, 5, 8 or 10. The relative growth rate ratios for each layer can be substantially the same, but could vary locally somewhat within the reactor deposition zone. The growth rate ratios generally apply to the layers when they are growing freely and independently of each other (i.e., before they meet and join to form the composite growth layer). The relative growth rate ratios generally correspond to the slope (rise/run) of the growth layer sidewalls as they grow outwardly and upwardly.

FIG. 10 illustrates a further step in the method for forming a composite SCD layer 163C or the large area SCD surface or substrate 163L. FIG. 10 is a cross-sectional view of the SCD substrates 163A1, 163A2 and layers 163B1, 163B2 in a diamond substrate holder 163D and after SCD deposition and further lateral growth to form the composite SCD layer 163C. Relative to FIG. 1B, deposition of the SCD layers 163B1, 163B2 is continued at least until they join together to form the composite (or single) SCD layer 163C. In an embodiment, initial deposition of the SCD layers 163B1, 163B2 can be paused at an intermediate time in the growth, before the edges of the layers 163B1, 163B2 contact and before formation of the composite SCD layer 163C. The SCD layers 163B1, 163B2 can be polished, and the SCD substrates 163A1, 163A2 (with the layers 163B1, 163B2) can be re-positioned in the substrate holder 163D such that the upper edges of the layers 163B1, 163B2 are in contact or in close proximity (e.g., within about 50-100 µm). The SCD substrates 163A1, 163A2 remain spaced apart, for example by a distance D' (which can be smaller than the original distance D, but generally within the same range of suitable lengths). Deposition of the SCD layers 163B1, 163B2 can be resumed such that they join and form the composite SCD layer 163C.

In an embodiment, the composite SCD layer 163C has a thickness in a range of 0.1 mm to 5 mm, for example at least 0.1, 0.2, 0.3, 0.5, 0.7, or 1 mm and/or up to 1, 1.5, 2, 3, 4, or 5 mm). The thickness is generally in the vertical growth direction, after the first and second SCD layers 163B1, 163B2 have grown together into the composite SCD layer 163C. The same general values can correspond to the thickness of the eventual large area SCD substrate 163L, which can be somewhat thinner, however, based on cutting and/or polishing of the composite SCD layer 163C top and bottom surfaces to form the large area SCD substrate 163L.

In an embodiment, the composite SCD layer 163C has a top (or upper) surface area that is at least 1.1 times the combined surface area of the first SCD substrate 163A1 growth surface T and the second SCD substrate 163A2 growth surface T, for example at least 1.1, 1.2, 1.3, 1.4, 1.5, 1.7, or 2 and/or up to 1.5, 2, 2.5, 3, 4, or 5 times increased surface area of the composite SCD layer 163C top surface relative to the combined SCD substrate growth surfaces. The foregoing ratios more generally apply to the composite SCD layer 163C top surface area relative to all of the SCD substrate growth surfaces in the growth method, for example when a plurality or more than two SCD substrates are used to form the composite SCD layer 163C and/or the corresponding large area SCD substrate 163L.

After deposition and formation of the composite SCD layer 163C, the diamond structure can be removed from the reactor 100. The cutting and optionally polishing (e.g., laser cutting or other chemical or mechanical cutting, etching, or polishing means) the composite SCD layer 163C can be cut and optionally polished (e.g., laser cutting or other chemical or mechanical cutting, etching, or polishing means) to form the large area SCD substrate 163L (shown in FIG. 1D) therefrom. The first and second SCD separate substrates 163A1, 163A2 and growth layers 163B1, 163B2 can be removed from the bottom of the composite SCD layer 163C (e.g., in the areas/regions before they grew together to form a single SCD layer). More generally all separate SCD substrates and growth layers can be removed when a plurality or more than two are used to form the eventual composite SCD layer 163C. The circumferential periphery of the composite SCD layer 163A1, 163A2 also can be removed, for example when it contains polycrystalline diamond (PCD) or other non-SCD growth regions, and/or to provide smooth substrate surfaces. In an embodiment, the large area SCD substrate 163L has a thickness in a range of 0.1 mm to 5 mm, for example at least 0.1, 0.2, 0.3, 0.5, 0.7, or 1 mm and/or up to 1, 1.5, 2, 3, 4, or 5 mm.

As described above in relation to FIG. 1E, the large area SCD substrate 163L can be cut and optionally polished into a plurality of smaller SCD substrates 163A1, 163A2, 163A3, and 163A4 each having a growth surface T. The smaller SCD substrates 163A1, 163A2, 163A3, and 163A4 can be used as the seed substrates in subsequent cycle of the disclosed method to form a new, even larger composite SCD layer 163C (shown as an outline in FIG. 1E) and corresponding large area SCD substrate 163L with a further increase in surface area. More generally, any number of the smaller SCD substrates can be used in the repeated method cycle to grow large area SCD substrates of continuously increasing size/area for repeated cycle of the method steps.

In an embodiment, the composite SCD layer 163C and/or the large area SCD substrate 163L has a crystallographic alignment of 1° or less, such as at least 0.001°, 0.01°, 0.02° or 0.05° and/or up to 0.1°, 0.2°, 0.3°, 0.4°, 0.5°, 0.6°, 0.7°, 0.8°, 0.9°, or 1°. Because the disclosed process can begin with a single SCD substrate that is cut into crystallographically complementary SCD pieces, it is easier to crystallographically align the SCD pieces to grow them back together again while maintaining a high degree of crystallographic alignment in the eventual composite SCD layer 163C and/or the large area SCD substrate 163L. This can lead to lower stress and relatively few dislocation defects at the boundary where the two or more SCD substrate pieces are grown together again. Previous prior art mosaic process for SCD substrate formation utilize x-ray diffraction analysis on two separate, distinct substrates (e.g., not cut from the same original SCD structure), and these substrates need to be laser cut and polished to be crystallographically aligned, resulting in poorer crystallographic alignment than in the method of the present disclosure. In the present method, the alignment accuracy of the laser cutting process to form the template recesses R1, R2 in the diamond substrate holder 163D is very high, for example within about 0.2° or less of the desired alignment. This high alignment accuracy of the substrate holder 163D recesses R1, R2 combined with crystallographically complementary SCD substrates 163A1, 163A2 allows the eventual composite SCD layer 163C and/or the large area SCD substrate 163L to have a correspondingly high degree of crystallographic alignment.

In an embodiment, the large area SCD substrate 163L has a (top or upper) surface area of at least 500 $mm^2$. For example, the surface area is suitably at least 500 $mm^2$, 625 $mm^2$ (about 1 $in^2$), 1500 $mm^2$, 2500 $mm^2$ (about 4 $in^2$), 5000 $mm^2$, 10000 $mm^2$ (about 16 $in^2$) and/or up to 3000, 5000, 7000, 10000, 15000, 20000, 23000 (about 36 $in^2$), or 30000 mm². The large area SCD substrate 163L can have any desired shape, such as a rectangular, square, or circular disk with a relatively large surface area and relatively low thickness, such as 0.1 mm to 5 mm (e.g., at least 0.1, 0.2, 0.4, 0.6, 0.8, or 1 mm and or up to 1, 2, 3, 4, or 5 mm). The large/primary surface of the large area SCD substrate 163L can be a (100) crystallographic surface.

FIG. 1D is a cross-sectional view of a high quality, highly crystallographically aligned large area SCD substrate 163L according to the disclosure used to form a duplicate high quality, highly crystallographically aligned large area SCD substrate 163M. As illustrated, an SCD layer 163M is deposited on a surface of the large area SCD substrate 163L. The SCD layer 163M can then be removed (e.g., via cutting, etching, and/or polishing) to form a duplicate large area SCD substrate corresponding to the removed SCD layer 163M and having the generally the same surface area, quality, and crystallographic alignment of the SCD substrate 163L along with any desired thickness (e.g., based on deposition time).

Deposition of SCD layers according to the disclosure can be performed using a microwave plasma assisted reactor (or microwave cavity plasma reactor; "MCPR") 100. Various illustrative geometric, structural, and operational features of the reactor 100 are described in more detail below with reference to FIGS. 2A-2F. The reactor 100 includes a (first) microwave chamber 10 (e.g., a cylindrical chamber 120 as illustrated) having an internal volume 122. In some embodiments, the microwave chamber 10 further includes an upper conducting short 140, which is in electrical contact with an outer wall (e.g., the outer wall of the cylindrical chamber 120) of the microwave chamber 10. The upper conducting short 140 is located in an upper portion of the microwave chamber 10 and defines at least a portion of an upper boundary thereof (e.g., having a generally annular surface defining a central opening 144 therethrough for an electromagnetic wave source 150). The reactor 100 also includes a plasma chamber 20 extending into the microwave chamber 10, which includes an outer wall defining at least a portion of the chamber 20, for example including a quartz bell jar 180 as a portion of the outer wall and defining an interior cavity 182 of the plasma chamber 20. The reactor 100 further includes an excitation probe 150 as an electromagnetic wave source, which is positioned and adapted to direct microwave energy into the microwave chamber 10 and the plasma chamber 20. As further shown, the reactor 100 includes a stage 160 (e.g., a coaxial stage, which could also be a conducting stage) with reference surface 163 (e.g., a substrate holder) extending into the plasma chamber 20/interior cavity 182 thereof. The reference surface 163 is positioned and adapted to supporting a substrate 163A upon which a component is deposited during operation of the reactor 100.

High Pressure Microwave Discharges

At high pressures and high power densities, microwave discharges in hydrogen gas have neutral gas temperatures in excess of 2500 K, contract and separate from the surrounding discharge chamber walls, and become a very non-uniform, intense and "arc like" discharge. As pressure is increased, the gas temperature and discharge power density increase, resulting in a floating discharge with increased active radical plasma species having the potential for increased growth rates. The formation of contracted and floating microwave discharges at high pressures, which are identified herein as microwave arcs, has been observed and studied in many experiments. The microwave arc, like lower frequency arcs, is a thermally inhomogeneous discharge. It has a hot central core, and sharp thermal gradients exist between the discharge center and the surrounding walls. Microwave energy is readily coupled into the electron gas in the hot discharge center because of its reduced gas density, and neutral gas species are also readily ionized, dissociated, and excited in the hot central discharge core. These high pressure microwave discharges have been applied as discharges in electrothermal thruster space engines and as high pressure, high power microwave discharge light sources.

An important difference between high pressure and low pressure microwave discharges is that the microwave discharge entirely fills the discharge chamber at low pressures and produces a diffusion loss dominated, cold (i.e., gas temperatures are less than 1000 K), non-equilibrium plasma. In the high pressure regime, the microwave discharge is hot (i.e., gas temperatures are greater than 2000 K), is volume recombination dominated, and becomes a more thermal-like discharge. Plasma densities for 2.45 GHz hydrogen discharges operating at 100 Torr to 200 Torr are estimated to be about $10^{11}$ cm$^{-3}$ to about $10^{13}$ cm$^{-3}$ (i.e., free electrons per unit volume). At these high pressures, the discharge separates from the walls and can become freely floating, taking on shapes that are related to the shape of the impressed electromagnetic fields. The discharge can even move about the discharge chamber as it reacts to the buoyant forces on the discharge and to the convective forces caused by the gas flows in the discharge chamber (e.g., source gas inlet and exhaust gas outlet).

Thus, high pressure microwave discharges behave very differently from the typical low pressure discharge and require new methods of discharge control and microwave applicator and plasma reactor design that take into account the distinctly unique nature of the high pressure microwave plasma. The goal in a CVD application is to control the size, the spatial location and the shape of this very hot, non-uniform discharge in such a manner to enable optimal CVD diamond synthesis. This is a formidable engineering challenge. High pressure plasma reactors and associated methods allow the spatial positioning and shaping of this thermally inhomogeneous, hot microwave discharge, thereby enabling the optimization of the diamond CVD process at high pressure.

Reactor Geometry

Figure 2A:
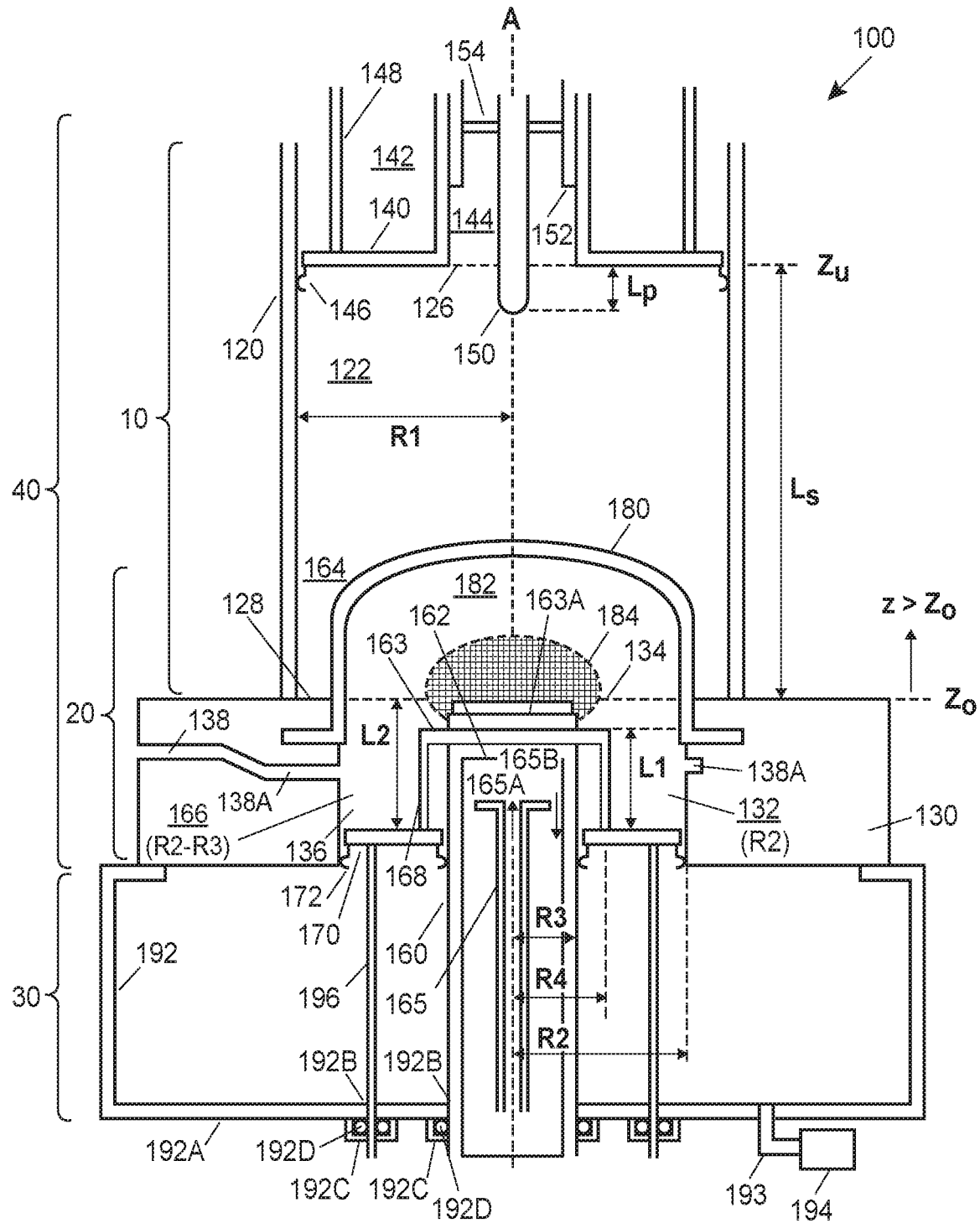
FIG. 2A is a cross-sectional view of a microwave plasma assisted reactor (or microwave cavity plasma reactor; "MCPR") embodiment according to the disclosure.
Figure 2B:
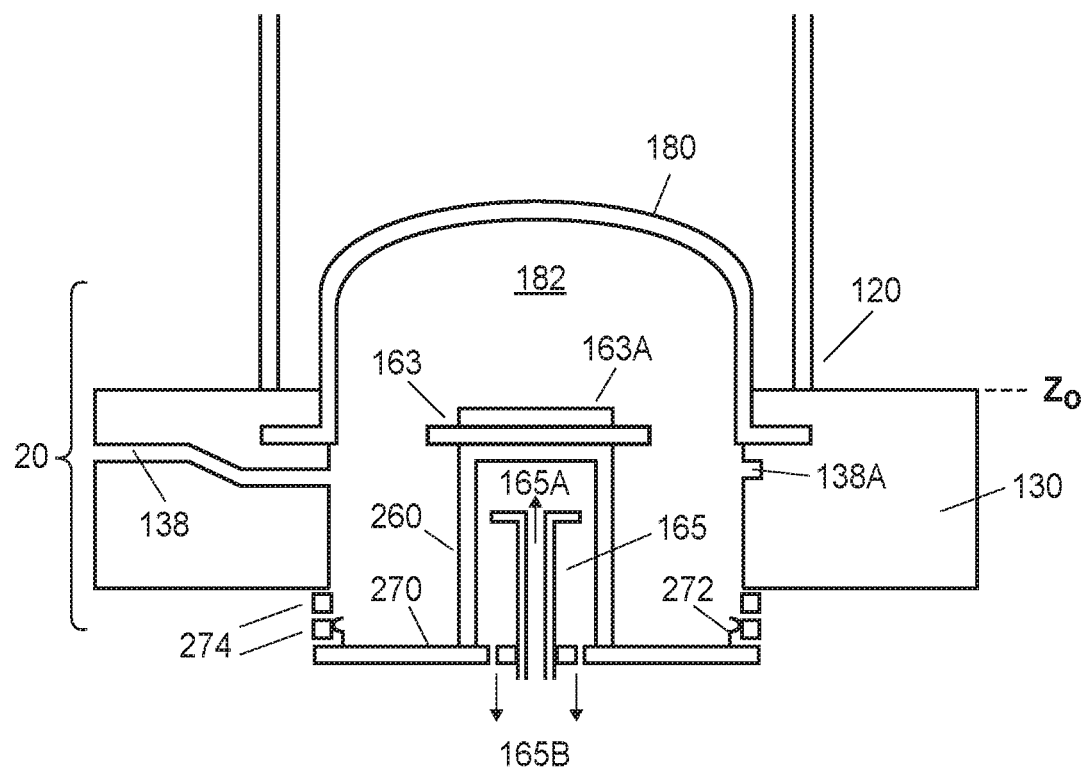
FIG. 2B is a cross-sectional view of an alternative embodiment for a plasma chamber for the microwave plasma assisted reactor of FIG. 2A.
Figure 2C:
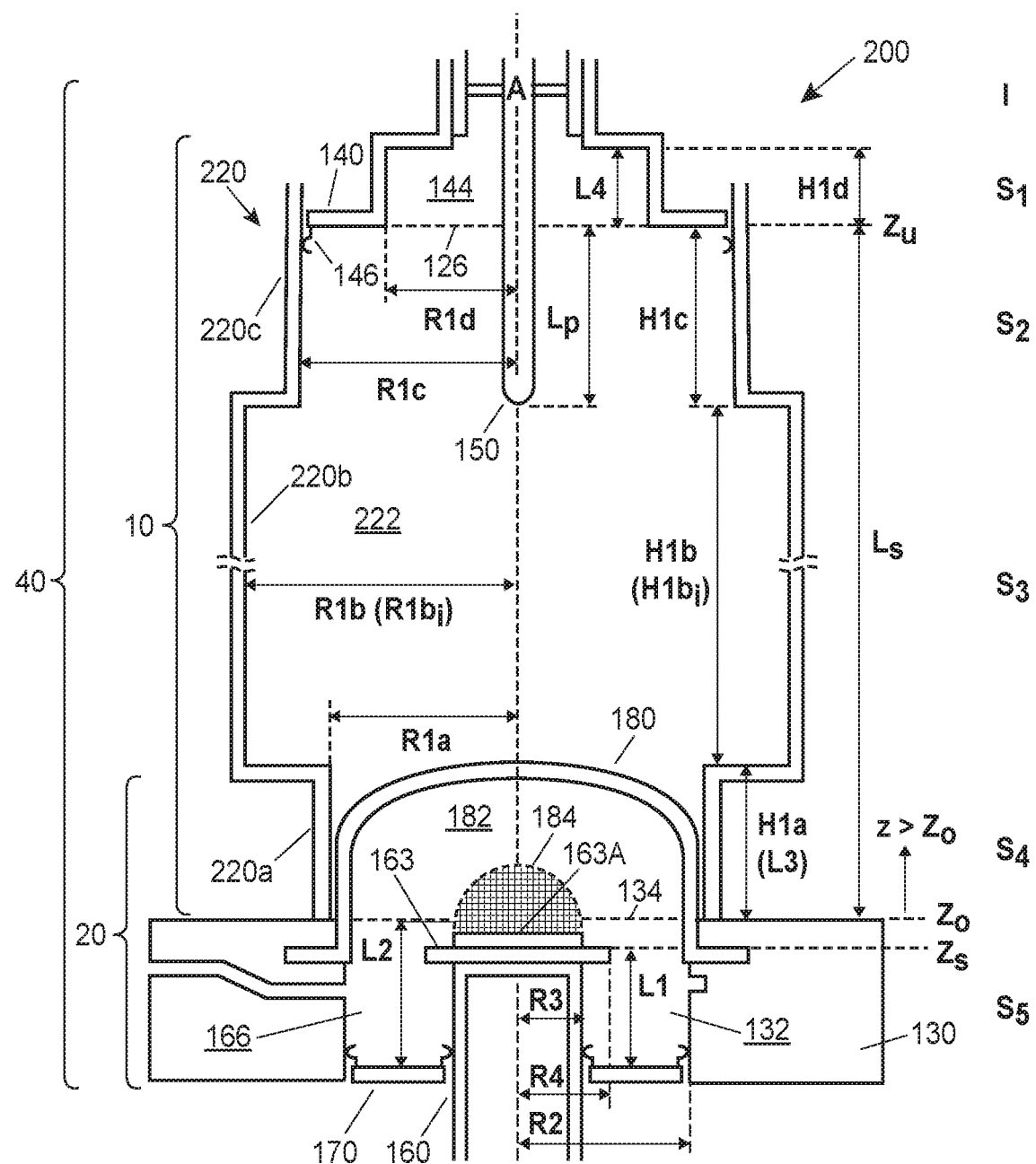
FIG. 2C is a cross-sectional view of a generalized microwave plasma assisted reactor embodiment according to the disclosure.
Figure 2D:
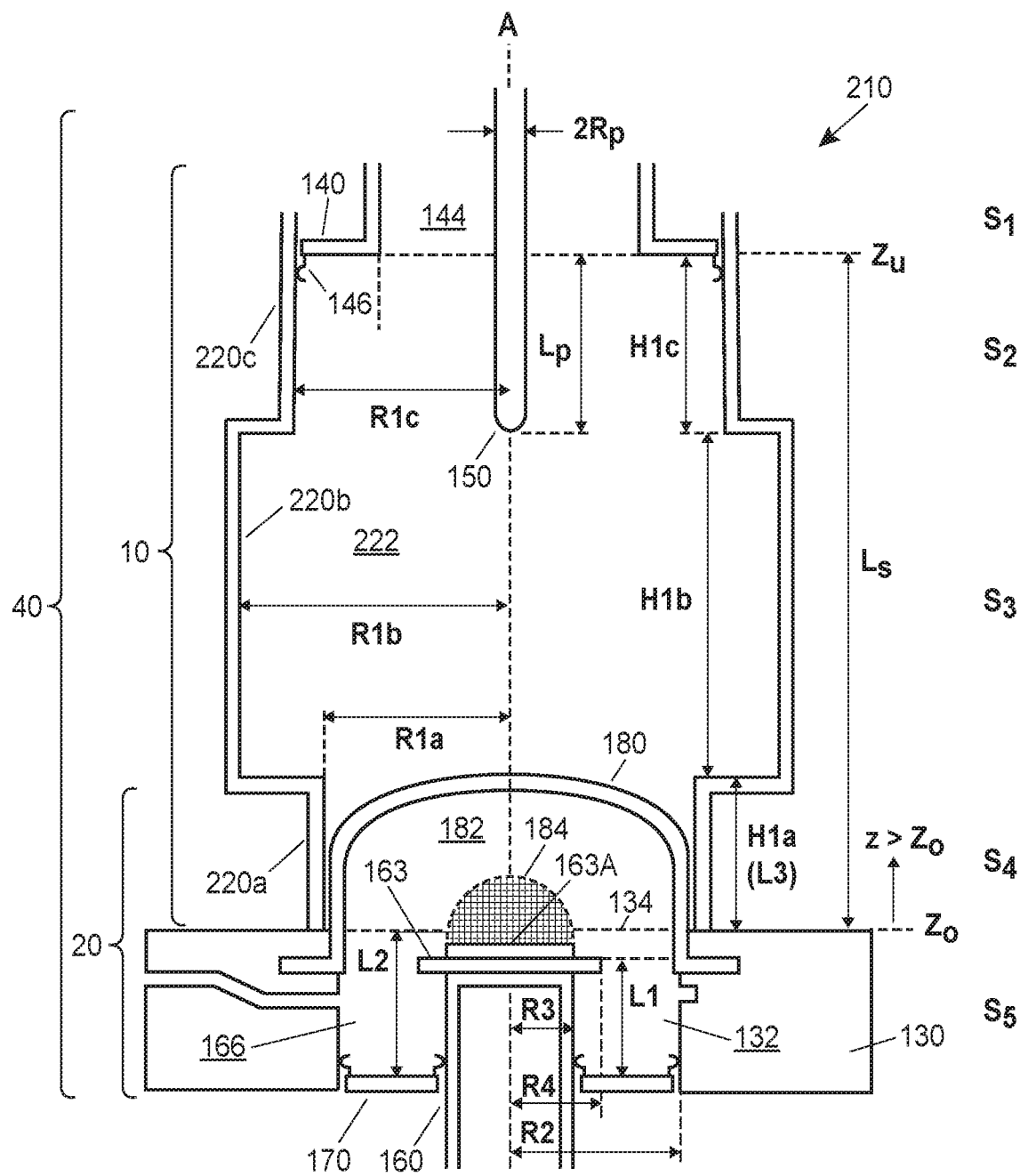
FIG. 2D is a cross-sectional view of a microwave plasma assisted reactor embodiment with a three-section microwave chamber according to the disclosure.
Figure 2E:
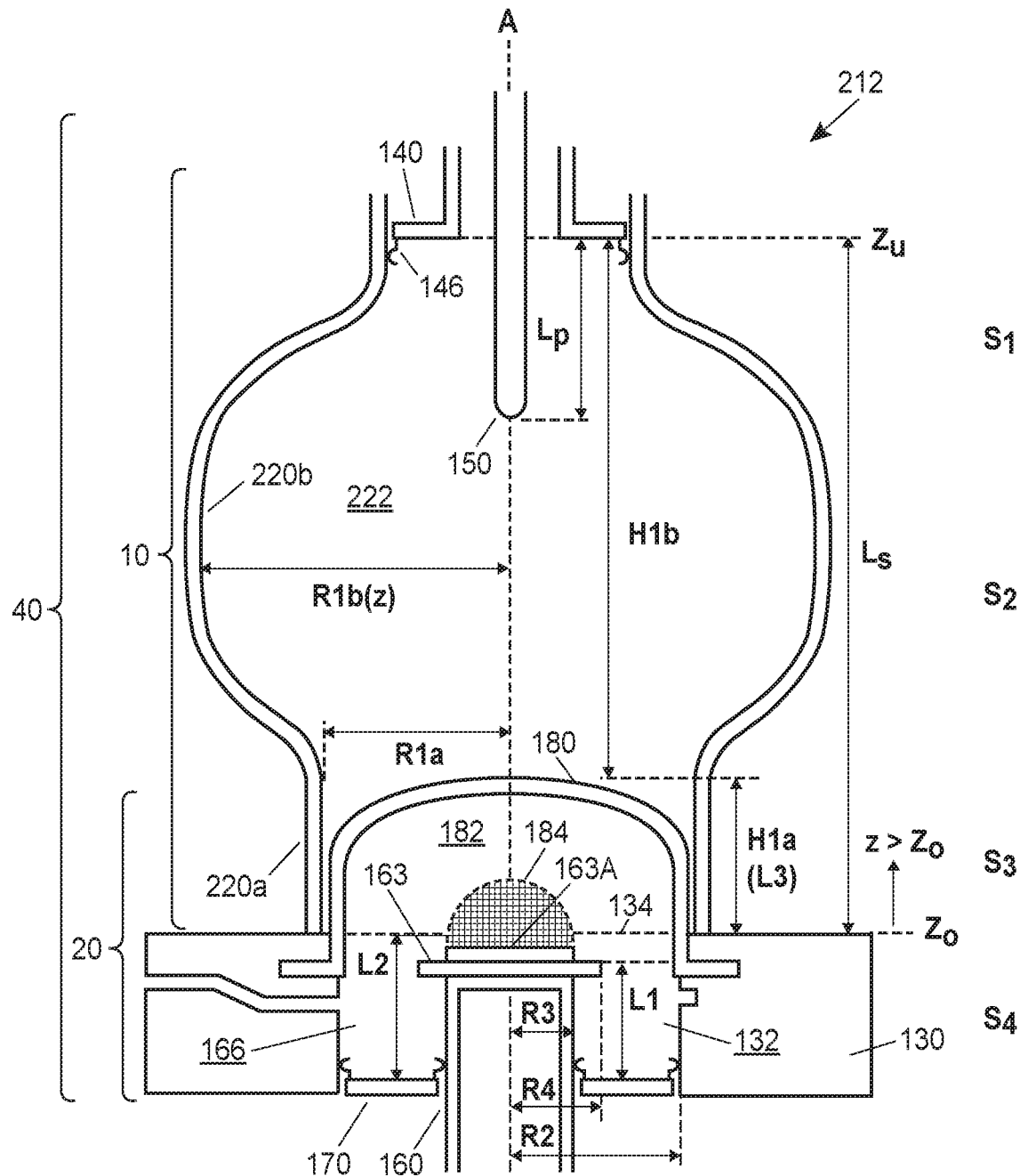
FIG. 2E is a cross-sectional view of a microwave plasma assisted reactor embodiment with a variable-radius microwave chamber according to the disclosure.
Figure 2F:
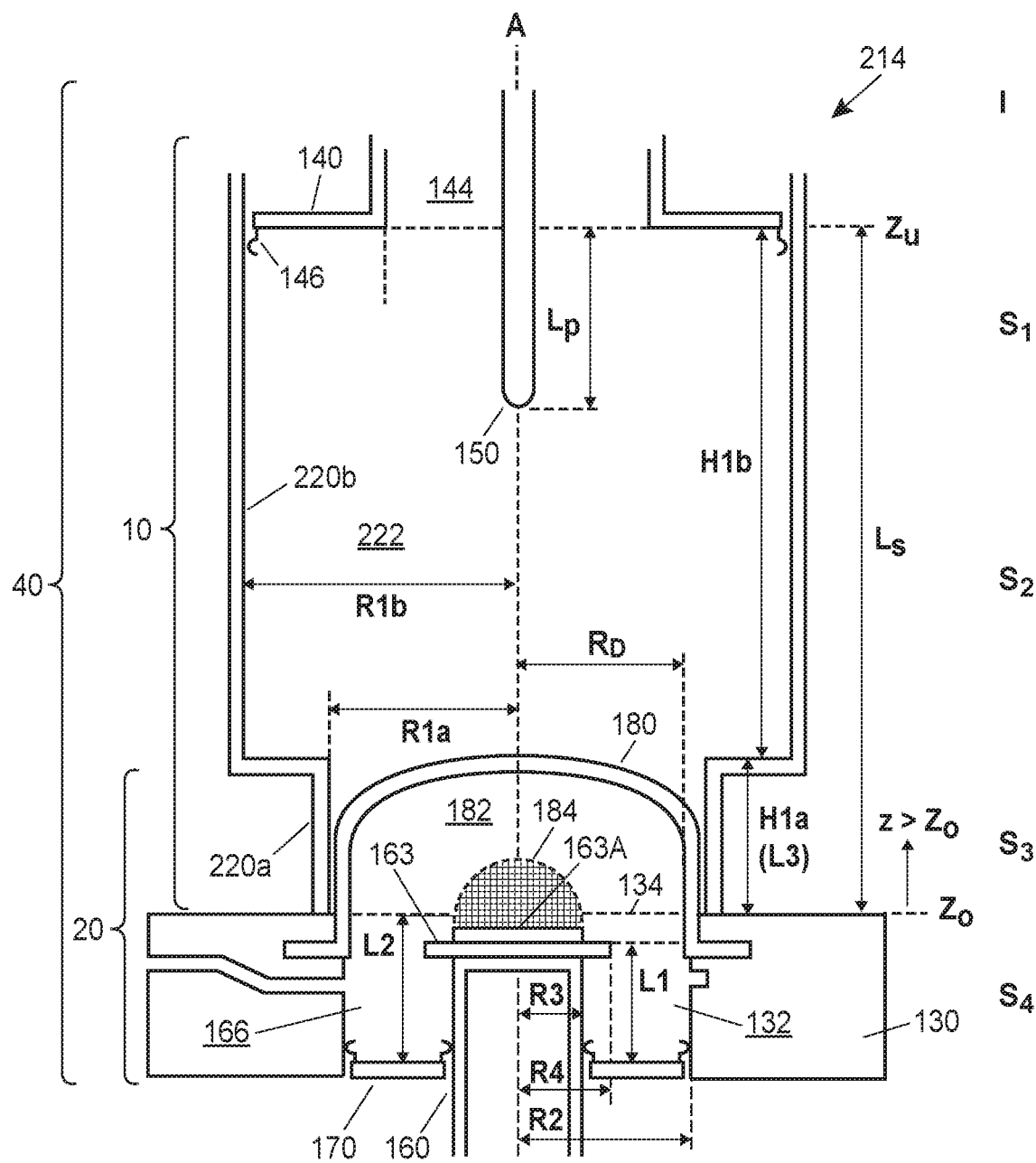
FIG. 2F is a cross-sectional view of a microwave plasma assisted reactor embodiment with a two-section microwave chamber according to the disclosure.

FIGS. 2A 2F illustrate various embodiments of microwave plasma assisted reactors 100 suitable for use according to the disclosure. Any of the various embodiments in FIGS. 2A-2F can be modified to include multiple SCD substrates 163A and/or a corresponding diamond substrate holder 163D in the reactor 100 and plasma chamber 20 during deposition in a method for forming a large area SCD surfaces or substrates, for example as described above and analogously illustrated in FIGS. 1A-1G.

A cross sectional view of a particular microwave plasma assisted reactor 100 is illustrated in FIG. 2A. The reactor 100 generally includes a microwave chamber/section 10, a plasma chamber/section 20, and a vacuum chamber/section 30. The reactor 100 has a generally cylindrical structure with components that are generally aligned along a central axis A (e.g., the z-axis in a cylindrical coordinate system with substantial component symmetry in the θ (or phi, φ) direction). Collectively, the microwave chamber 10 and the plasma chamber 20 are referenced as an applicator 40. The microwave chamber 10 and the plasma chamber 20 meet at a reference axial location $Z_0$ (or z=0). The applicator 40 includes two coupled cavities at the $Z_0$ plane: a cylindrical cavity section (z≥$Z_0$) and a coaxial cavity section (z≤$Z_0$).

The microwave chamber 10 includes a cylindrical chamber 120 (e.g., an open-ended metallic cylinder) defining an interior cylindrical cavity 122 of radius R1 aligned with the central axis A. The cylindrical cavity 122 has a lower boundary 128 (e.g., a metallic portion of the base 130) at the reference axial location $Z_0$ and an upper boundary 126 at an axial location $Z_u > Z_0$ (i.e., the microwave chamber 10 generally extends upwardly in an axial direction $z > Z_0$). The microwave chamber 10 can be cooled with an external coolant, for example with cooling lines (e.g., for water or other cooling liquid) on the exterior of the cylindrical chamber 120 and/or with a cooling gas inlet/outlet (e.g., for air or other cooling gas) in fluid communication with the cylindrical cavity 122. As illustrated, the cylindrical chamber 120 has a uniform radius R1 throughout its height. In alternative embodiments, the cylindrical chamber 120 can have a multi-section construction, for example including a first cylindrical chamber of radius R1$a$ (or other characteristic width dimension for non-cylindrical chambers) adjacent to the base 130 and a second cylindrical chamber of radius R1$b$ adjacent to the first cylindrical chamber and extending upwardly away from the base 130. In general, R1$a$ can be less than or greater than R1$b$ depending on the resulting influence upon the microwave field in the microwave chamber 10.

The microwave chamber 10 further includes an upper conducting short 140 in electrical contact with the cylindrical chamber 120 and disposed in an upper portion 142 of the cylindrical chamber 120 at an axial distance Ls above Z0. The upper conducting short 140 has a central opening 144, defines the upper boundary 126 of the cylindrical chamber 120, and is electrically connected to the side walls of the cylindrical chamber 120 via finger stocks 146. Preferably, the upper conducting short 140 is slidably disposed in the cylindrical chamber 120, and its axial position can be adjusted by any suitable means, for example using a sliding (e.g., threaded) rod/gear assembly (e.g., via rods 148 (mounted to the upper conducting short 140) and as illustrated in more detail in U.S. Pat. No. 5,311,103; incorporated herein by reference).

The microwave chamber 10 further includes an excitation probe 150 as an electromagnetic wave source extending through the central opening 144 of the upper conducting short 140 and into an upper portion of the cylindrical cavity (or microwave chamber) 122 by an axial distance Lp relative to the upper boundary 126. The excitation probe 150 is generally capable of generating radiofrequency waves in the UHF (e.g., about 300 MHz to about 3 GHz) and/or microwave (e.g., about 300 MHz to about 300 GHz or about 300 MHz to about 100 GHz) frequency domain. Suitable specific excitation frequencies include 915 MHz and 2.45 GHz. As illustrated, the excitation probe 150 is supported in an inner sleeve 152 by an insulator/holder 154. The inner sleeve 152 preferably is adjustably mounted on the interior annular surface of the upper conducting short 140. Similar to the upper conducting short 140, the excitation probe 150 also is adjustably disposed in the cylindrical chamber 120, and its axial position can be adjusted by any suitable means, for example using a gear assembly to slide the inner sleeve 152 and the excitation probe 150 as a unit relative to the upper conducting short 140 (e.g., as illustrated in U.S. Pat. No. 5,311,103; incorporated herein by reference). In an embodiment, the axial positions of both the upper conducting short 140 and the excitation probe 150 are independently adjustable to provide an impedance tuning mechanism to minimize reflected power in the cylindrical cavity 122.

The plasma chamber 20 includes a base 130 (e.g., a metallic base) that defines an interior base cavity 132 (e.g., a cylindrical cavity of radius R2) and that is mounted to the cylindrical chamber 120 of the microwave chamber 10. The interior base cavity 132 has (i) an upper boundary 134 at $Z_0$ and adjacent the cylindrical chamber 120 and (ii) a lower portion 136 extending axially downwardly in a direction $z < Z_0$. As illustrated, the base 130 includes a source/feed gas inlet in fluid connection with the base cavity 132, for example a conduit 138 extending through the base 130 and opening into the base cavity 132 through an annular manifold 138A (or other similar structure for tangentially distributing the source gas). The plasma chamber 20 further includes a quartz bell jar 180 mounted in/on the base 130 and extending upwardly into a bottom portion 164 of the cylindrical cavity 122 (i.e., $z > Z_0$). Together, the base 130 and the quartz bell jar 180 define an interior cavity 182 of the plasma chamber 20 (e.g., by an outer wall/boundary including the quartz bell jar 180 and the interior surface (i.e., at $r = R2$) of the base 130). The base 130 optionally can include cooling channels (e.g., a water cooling channel and/or a gas cooling channel; not shown) that circulate one or more coolants through the base 130 to provide a mechanism for controlling the temperature of the base 130, the quartz bell jar 180, and/or the interior cavity 182 of the plasma chamber 20 during operation of the reactor 100.

The plasma chamber 20 further includes a coaxial stage 160 (e.g., a conductive stage, for example a metallic tube) having a radius R3 and an upper surface 162. The coaxial stage 160 extends at least into the base cavity 132 and optionally into the bottom portion 164 of the cylindrical cavity 122 (i.e., the axial position of the upper surface 162 can be $z \leq Z_0$ or $z > Z_0$ based on the axially adjustable nature of the coaxial stage 160). The coaxial stage defines a coaxial cavity (or microwave chamber) 166 between R3 and R2 in the base cavity 132. A substrate holder 163 (e.g., a molybdenum substrate holder) having a radius R4 is mounted on the upper surface 162 of the coaxial stage 160; during operation of the reactor 100, a deposition substrate 163A is placed on the substrate holder 163. The thickness (i.e., in the z-direction) of the substrate holder 163 is suitably about 0.6 cm; however, the thickness can be varied as an additional means to independently vary L1 and L2. As illustrated, the substrate holder 163 is a flat, disk-shaped structure. Alternatively, the substrate holder 163 can contain a recess (not shown) in its upper surface facing the interior cavity 182, and the deposition substrate 163A is seated in the recess during operation. In an embodiment, the coaxial stage 160 includes internal structure to cool (or otherwise control the temperature of) the substrate 163A during operation. As illustrated, a conduit 165 in the interior of the coaxial stage 160 provides an inlet for a (relatively cold) coolant 165A (e.g., gas or liquid, preferably water) that serves as a heat transfer medium to withdraw heat from the substrate 163A and then exits the coaxial stage 160 as a heated coolant 165B. Alternatively, a relatively hot stream 165A can be used to warm the substrate 163 and then exit as a cold stream 165B.

The plasma chamber 20 further includes a lower conducting short 170 adjustably disposed in the coaxial cavity 166 below $Z_0$ and in electrical contact with the base 130 and the coaxial stage 160 via finger stocks 172. As illustrated, the lower conducting short 170 has a solid annular construction (e.g., a metallic construction); however, the lower conducting short 170 can include one or more channels (or other orifices; not shown) that allow effluent gases to escape from the interior cavity 182 of the plasma chamber 20 into the vacuum chamber 30. The axial distance between the lower conducting short 170 and $Z_0$ is L2, and the axial distance between the lower conducting short 170 and the substrate holder 163 (or a base or bottom portion of the substrate 163A) is L1. Alternatively, the distance L1 can be measured between the lower conducting short 170 and an upper or top portion of the substrate 163A. Together, the two distances define a difference $\Delta L = L1-L2$ that denotes the displacement of the coaxial stage 160, substrate holder 163, and the substrate 163A from $Z_o$.

As illustrated in FIG. 2A, the plasma chamber 20 can further include a quartz tube holder 168. The quartz tube holder 168 is generally mounted on the lower conducting short 170 and extends upwardly to the substrate holder 163. The quartz tube holder 168 has a radius slightly larger than that of the coaxial stage 160, thereby defining an annular gap between the quartz tube holder 168 and the coaxial stage 160. The quartz tube holder 168 controls the flow of exhaust gas leaving the interior cavity 182 of the plasma chamber 20. Specifically, the substrate holder 163 has holes/conduits (not shown) at the outer radial positions of the substrate holder 163, thereby directing exhaust gas from the interior cavity 182 into the annular gap between the quartz tube holder 168 and the coaxial stage 160. In this case, holes/conduits are placed in the lower conducting short 170 at radial positions between the quartz tube holder 168 and the coaxial stage 160. In an embodiment (not shown), the quartz tube holder 168 can be fixed/mounted to the substrate holder 163 and can have portions that slidably extend through accommodating openings in the lower conducting short 170. In this case, L1 and L2 can be slidably adjusted without having to insert a quartz tube holder 168 of variable height.

FIG. 2B illustrates an alternate embodiment of the lower conducting short 270. The lower conducting short 270 has a disk-shaped structure (e.g., a metallic construction) that is in electrical contact with the base 130 (via finger stocks 272) and with the conducting stage 260 (via direct contact). The axial position of the lower conducting short 270 is adjustable in the coaxial cavity 166 below $Z_0$ by selecting one or more conducting shim inserts 274 (e.g., conducting annular metallic rings of predetermined height) that are interposed between the base 130 and the lower conducting short 270. The structure illustrated in FIG. 2B is held in place during operation, for example, with bolts (not shown) that extend through lower conducting short 270, the shim inserts 274, and into the base 130. As illustrated, the coaxial stage 260 is a cylinder mounted on the lower conducting short 270; however, the coaxial stage can have similar cooling structure as that illustrated in FIG. 2A (e.g., a coolant inlet and a coolant outlet passing through conduits in the lower conducting short 270 and into the interior of the coaxial stage 260).

An aspect of the disclosed reactors is that the geometric reactor length scales L1 and L2 are adjustable by altering the axial location of the lower conducting short 170/270 in the coaxial cavity 166. In FIG. 2A, the illustrated conducting short 170 is a slidable, annular disk that can be moved in the axial direction before and/or during the operation of the reactor 100. In FIG. 2B, the illustrated conducting short 270 is a disk that can be repositioned in the axial direction by altering the number and/or size of the shim inserts 274 that are axially interposed between the base 130 and the lower conducting short 270. Preferably, both of the length scales L1 and L2 are independently adjustable. Thus, in the embodiment illustrated in FIG. 2A, the coaxial stage 160 is independently slidable/adjustable relative to the conducting short 170 such that L2 can be independently adjusted before and/or during the operation of the reactor 100. In the embodiment illustrated in FIG. 2B, the height of the coaxial stage 260 can be adjusted by selecting stages of differing height for mounting to the conducting short 270. The specific methods for adjusting L1 and L2 are not particularly limited, and can include any of a variety of known methods (e.g., using a gear assembly, using an o-ring sealed movable rod, manually repositioning the components, etc.).

The vacuum chamber 30 is defined by vacuum chamber walls 192 that are mounted to the base 130 of the plasma chamber 20 to provide an air-tight seal. The vacuum chamber 30 further includes a conduit 193 through the chamber walls 192 that is connected to a vacuum pump 194 that helps maintain a desired operating pressure in the plasma chamber 20 during operation. As illustrated, a base portion 192A of the chamber walls 192 can include one or more conduits/openings 192B that permit the structural/mechanical coupling of various elements in the plasma chamber to the external environment. For example, vacuum seals 192C (e.g., including an o-ring 192D) can accommodate slidable rods 196 that are attached to the lower conducting short 170 and that extend through the vacuum chamber 30 to the external environment. The rods 196 can be repositioned to adjust the axial position of the lower conducting short 170 by any of a variety of methods (e.g., manual, coupling to a gear assembly similar to that used to adjust the position of the upper conducting short 140, where the gear assembly can be under manual and/or automatic control). As illustrated, a conduit 192S also is provided for the coaxial stage 160 (and any internal structure such as the conduit 165) so that the coaxial stage 160 can be axially repositioned similarly to the slidable rods 196 and the lower conducting stage 170.

Characteristic dimensions and coordinates of the reactor 100 are shown in FIG. 2A. They are the distance $L_p$ that the excitation probe 150 extends beyond the conducting short 140, the height $L_s$ of the cylindrical cavity 122, the radius R1 of the cylindrical cavity, the radii R2 and R3 that define the annular width of the coaxial cavity 166, the radius R4 of the substrate holder 163, the thickness D of the substrate holder 163, and lengths L1 and L2 in the coaxial cavity 166 defining the position of the lower conducting short 170 and the coaxial stage 160. Generally, $R1 \geq R2 \geq R4 \geq R3$ and $L_s \geq L1$ and L2, although other variations are possible. The substrate 163A itself is located approximately at $Z_0$ near the open end of the coaxial cavity 160 on the substrate holder 163. Thus, the upper surface 162 of the conducting coaxial stage 160 serves as a platform for the substrate holder 163, and the interior of the coaxial stage 160 allows temperature control of the substrate 163A (e.g., via water cooling/heating as illustrated). The conducting coaxial stage 160 and the substrate holder 163 are collectively identified as the powered electrode. The difference between L1 and L2 (i.e., $L1-L2=\Delta L$), is the distance that the top surface of the powered electrode or the substrate surface is above or below the cylindrical cavity 122 bottom $Z_0$ plane (z=0).

The specific dimensions of a given reactor design generally scale inversely with the microwave excitation frequency of the excitation probe 150 (i.e., relatively higher probe 150 frequencies generally call for smaller reactor scales and vice versa). Two common excitation frequencies are 2.45 GHz and 915 MHz. For a 2.45 GHz-reactor, suitable dimensions include R1 ranging from about 6 cm to about 12 cm or 18 cm (e.g., about 8.9 cm), R2 ranging from about 5 cm to about 10 cm or 15 cm (e.g., about 7.0 cm), R3 ranging from about 0.5 cm to about 5 cm or 8 cm (e.g., about 0.95 cm, 1.9 cm, or 4.1 cm)), R4 ranging from about 1 cm to about 6 cm or 12 cm (e.g., about 3.25 cm), $L_s$ ranging from about 15 cm to about 25 cm (e.g., about 20 cm), $L_p$ ranging from about 2 cm to about 5 cm (e.g., about 3.6 cm), and/or L1 and L2 independently ranging from about 4 cm to about 8 cm (e.g., |ΔL| about 2 cm, 1 cm, or 0.5 cm or less, including cases where ΔL≠0 (i.e., a net displacement of the substrate 163/coaxial stage 160 from $Z_0$)). For a 915 MHz-reactor, suitable dimensions include R1 ranging from about 15 cm to about 25 cm or 40 cm (e.g., about 30 cm), R2 ranging from about 5 cm to about 30 cm (e.g., about 15 cm), R3 ranging from about 2 cm to about 20 cm (e.g., about 9.5 cm), R4 ranging from about 2 cm to about 20 cm (e.g., about 12 cm), $L_s$ ranging from about 40 cm to about 80 cm (e.g., about 60 cm), $L_p$ ranging from about 5 cm to about 15 cm (e.g., about 8 cm), and/or L1 and L2 independently ranging from about 10 cm to about 20 cm (e.g., |ΔL| about 5 cm, 2 cm, or 1 cm or less, including cases where ΔL≠0 (i.e., a net displacement of the substrate 163/coaxial stage 160 from $Z_0$)).

The ratio R3/R2 can be up to about 0.8 in many applications. An aspect of the disclosure, however, is that a reduction in the size/diameter of the coaxial stage 160 allows an increase in the applied power density of the plasma in a manner that is controllable to permit uniform and high deposition rates (e.g., of diamond) on the substrate 163A. Thus, the radius R3 is suitably small relative to R2. For example, the ratio R3/R2 is suitably about 0.5 or less, about 0.4 or less, about 0.3 or less, or about 0.2 or less. Due to practical structural considerations (e.g., if the coaxial stage 160 include internal temperature control structure), the ratio R3/R2 is suitably about 0.05 or more, or about 0.1 or more.

Another aspect of the disclosure is that relatively fine adjustments of the axial positions of the lower conducting short 170 and/or the coaxial stage 160 (e.g., in the neighborhood of $Z_0$) allow positioning of the electromagnetic focus of the plasma above the substrate 163A to provide an additional means to control deposition rates. Thus, during or before operation (e.g., when tuning the reactor and/or when depositing a component), the distance ΔL is suitably small relative to L1 and/or L2. For example, the ratio |ΔL|/L1 or |ΔL|/L2 is suitably about 0.5 or less, about 0.2 or less, about 0.1 or less, or about 0.05 or less. In practice, a desirable, tuned value of ΔL is non-zero, and often ΔL<0 during operation.

The disclosed reactor can be provided in the form of a kit that facilitates the selection by a user of specific geometric embodiments. For example, the kit can include a microwave plasma assisted reactor according to any of the disclosed embodiments in conjunction with at least one of: (a) a plurality of cylindrical chambers, each defining an interior cylindrical cavity of a different radius R1; (b) a plurality of bases, each defining an interior base cavity of a different radius R2; and, (c) a plurality of coaxial stages, each having a different radius R3. When the kit includes a plurality of bases, a plurality of appropriately sized quartz bell jars and lower conducting shorts (whether disk-shaped, annular, or otherwise) are also included in the kit. Similarly, when the kit includes a plurality of coaxial stages, a plurality of appropriately sized lower conducting shorts also can be included in the kit (e.g., annular lower conducting shorts should be complementary in size with the individual coaxial stages; however, a single disk-shaped lower conducting short can accommodate the plurality of coaxial stages). A plurality of shim inserts (with the same or different heights) also can be provided in the kit. Thus, the reactor can be assembled with any combination of the cylindrical chambers, the bases, the coaxial stages, and any attendant complementary parts such that at least one of R1, R2, and R3 can be varied in a selected reactor assembly.

Variable-Chamber Reactor Designs

A generalized MCPR can have many separate cylindrical coaxial and cylindrical waveguide sections each with different radii and variable lengths. An example of a generalized reactor design 200, which consists of an input section I and reactor sections S1-S5, is shown in FIG. 2C. Analogous to FIG. 2A, the microwave chamber 10 includes a multi-section and/or variable-radius chamber 220, for example including cylindrical sections 220a, 220b, and 220c which define corresponding reactor sections S2-S4 (e.g., metallic sections with a step-wise (shown), linear, or curved profile transition therebetween). The chamber 220 and its sections 220a-c define an interior cavity 222 with respective radii and heights of R1a, R1b, and R1c and H1a (or L3), H1b, and H1c relative to the central axis A. As shown, the sliding short 140 can have a variable radius design (e.g., also with a step-wise profile as shown) to define the reactor section S1 and the cylindrical cavity 144 with radius R1d and height H1d (or L4) adjacent to the uppermost section of the cavity 222 (e.g., reactor section S2 defined by the cylindrical section 220c as illustrated).

The purpose of each section S1-S5 is (1) to guide and transmit microwave energy to the discharge load, (2) to impedance match the microwave power into the discharge, and (3) to appropriately spatially focus or refocus the microwave energy as it is transmitted through each individual waveguide section. By adjusting the position $Z_s$ of the substrate 163A in sections S4 and S5 above and below the $Z=0$ plane ($Z_0$; where $Z_s<Z_0$ is below $Z_0$ and $Z_s>Z_0$ is above $Z_0$), the electromagnetic (EM) field in the vicinity of the substrate 163A can be varied (although the electric field is primarily in the axial direction, both Ez and Er electric field components vary as $Z_s$ is varied) to achieve the desired CVD process growth rate and growth uniformity. The choice of the specific configuration (e.g., the number of and the specific lengths of each of the cylindrical waveguide sections) employed in a particular design depends upon on the requirements of the particular application. As is indicated in FIG. 2C, the waveguide section S3 can be further divided into multiple sections, each with a different radius R1b, and length/height H1b, (e.g., i=1 to n, where n is the number of sub-sections for waveguide section S3). In this case, R1b/R1a can be greater than 1 to represent a focusing contraction. In various embodiments, the ratio $R1b_{i+1}/R1b_i$ can be less than or greater than one for adjacent subsections i and i+1 depending on whether the EM energy is being locally focused or defocused by the subsections. Similarly, the (coaxial) waveguide section S2 and the (cylindrical) waveguide section S4 can be further divided into multiple sections, each with a different radius $R1c_i$ or $R1a_i$ and length/height $H1c_i$ or $H1a_i$, respectively (e.g., i=1 to n, where n is the number of sub-sections for the waveguide section). In various embodiments, successive sections $R1c_i$ can be expanding and successive sections $R1a_i$ can be contracting in the direction from $Z_U$ to $Z_0$ to provide desired defocusing or refocusing, respectively, of EM energy passing through the microwave chamber 10.

As used herein, "focused" (or "refocused") and "defocused" are terms indicating a relative increase or decrease, respectively, in the electromagnetic power density of microwave energy in a microwave cavity/chamber, such as between neighboring or adjacent regions of the microwave cavity/chamber. Generally, the microwave energy density becomes focused or refocused as the wave propagates through the microwave cavity/chamber from a region having a relatively larger cross sectional area to a region having a relatively smaller cross sectional area (e.g., a sudden or gradual contraction in cross sectional area, such as in a plane generally perpendicular to a primary direction of propagation of electromagnetic energy in the apparatus). Similarly, microwave energy flux density generally becomes defocused as it propagates through the microwave cavity/chamber from a region having a relatively smaller cross sectional area to a region having a relatively larger cross sectional area (e.g., a sudden or gradual expansion in cross sectional area, such as in a plane generally perpendicular to a primary direction of propagation of electromagnetic energy in the apparatus). For example, in the context of FIG. 2C, microwave energy emanating from the probe 150 is defocused as it propagates from section S2 to S3, and it is focused/refocused as it propagates from section S3 to S4 and into the plasma chamber 180.

A cross section of an embodiment of the more generalized reactor 200 design is shown in FIG. 2D as reactor 210. The internal cavity 222 is cylindrically symmetric about a center z-axis A, and the $Z_0$ plane is identified as the bottom of the reactor 210 and the top of the substrate holder 163 is located in the vicinity of the Z0 plane. The reactor 210 shown in FIG. 21 is divided into five interconnected but distinct cylindrical waveguide sections S1-S5. From the top to the bottom, these are identified as: section S1 which is the coaxial input microwave feed; section S2 which is a length-adjustable coaxial waveguide impedance-matching section of length $L_p$ and radius R1c; section S3 which is a cylindrical waveguide section of length Ls-L3-Lp and of radius R1b; section S4 which is an additional cylindrical waveguide section of radius R1a and length L3; and section S5 which is a variable length, coaxial cavity section with radii R2 and R3 and variable length L2. The probe 150 has a radius Rp and the position of the probe 150 and/or sliding short 140 can be adjusted to select the desired length Lp (e.g., independently adjusted such that Lp and H1c can be the same or different). The length L1 of the cylindrical center conductor of section S5 is also independently variable (e.g., as described above relative to FIGS. 2A and 2B for the sliding short 170). The substrate 163A is placed on the top of the center conductor 163 of section S5 near the $Z_0$ plane. Thus the position $Z_s$ of the substrate 163A is independently variable and is defined by $Z_s$=L1-L2. The center conductor 163 of section S5 also serves as the substrate holder 163 and can be independently externally heated or cooled as described above.

As shown in FIG. 2D, section S1 is the coaxial waveguide input power port. Section (2), the second cylindrical coaxial waveguide section, behaves as an impedance matching section where in practice Lp is often adjusted to be close to a quarter TEM wavelength. In practice, the radial dimensions of this section (R1c and Rp), can be chosen to allow the propagation of a single TEM mode or the propagation of both the coaxial TEM and $TM_{01}$ modes. Section S3 also acts like an impedance matching section and, for this embodiment, the radius R1b is larger than the radii R1d and R1c of sections S1 and S2, respectively (e.g., R1b>R1c>R1d). This causes an EM field intensity redistribution over the waveguide cross section of section S3 and, for a given high input power operation, allows a lower EM power flux density (W/cm²) to be transmitted through the empty waveguide region of section S3 than the power flux density being transmitted through sections S1 and S2. Thus, section S3 defocuses the microwave power as it is transmitted through the reactor 210 preventing at high input powers discharge formation in section S3.

Section S4 also behaves like an additional impedance matching and EM field refocusing section. Since it is desired to create an intense EM field region above the substrate 163A around the $Z_0$ plane and then maintain a discharge in this region at the center axis A of the reactor 210, the EM fields in section S4 are refocused onto the substrate holder 163 location around the $Z_0$ plane. This is accomplished by reducing the radius from R1b in section S3 to R1a of section S4 and then adding the appropriate, additional coaxial waveguide section S5 to the bottom of the applicator 40 enabling a strong electric field to be produced along the central z-axis A at the surface of the substrate 163A while avoiding power discharges in the microwave chamber 10.

Section S5 (—L2≤z≤0), behaves as a TEM mode coaxial waveguide section. When excited with 2.45 GHz microwave energy, only the TEM waveguide mode is excited in this section. By adjusting the coaxial cavity lengths L1 and L2 to about 6.12 cm, which is a half TEM wavelength, a standing wave $TEM_{001}$ mode EM field exists in this section and a perpendicular electric field is produced on the surface of the substrate 163A. The substrate position $Z_s$ is further adjusted by slightly varying L1 to position the substrate 163A above or below the $Z_0$ plane as desired.

Another embodiment of the generalized reactor 200 is shown in FIG. 2E as reactor 212 with a contoured, smooth curving wall/section 220b. The individual sections each with a different radii and length are replaced by a wall/section 220b with a continuously varying radius R1b(z). As illustrated, from the top $Z_U$ of the applicator 40 down toward the $Z_0$ plane, the radius R1b(z) first increases and then, as the substrate location $Z_s$ is approached, the radius R1b(z) decreases. Thus, the discrete cylindrical sections shown in FIG. 20 can be replaced with a gradual, continuously varying wall/section of radius R1b(z). The particular variation of R1b(z) depends on the desired EM unfocusing and refocusing that is desired and may be selected based on the specific plasma processing application. As shown, the curved, continuously varying section 220b can be connected to a generally cylindrical section 220a as described above. In other embodiments, the curved section 220b can extend to the base 130 at $Z_0$ of the applicator 40.

Another embodiment of the generalized reactor 200 is shown in FIG. 2F as reactor 214 having two cylindrical sections with radii R1a and R1b (e.g., R1a<R1b as illustrated). As shown in FIG. 2F, the reactor 214 includes five cylindrical waveguide sections: the input section I and reactor sections S1-S4. The illustrate reactor 214 has four mechanically independent cavity applicator 40 adjustments: (1) variable coupling probe 150 length Lp, (2) variable substrate holder 163 length L1, (3) variable top plate sliding short 140 position Ls, and (4) variable lower conducting short plate 170 position L2. These enable process optimization and impedance matching and are varied for discharge control as input power, pressure, gas flow, substrate holder design, etc. are varied.

Reactor Operation

In practice, the plasma loaded applicator is excited with the hybrid $TM_{013}+TEM_{001}$ electromagnetic mode. In order to achieve $TM_{013}$ excitation in the open cylindrical cavity 122, $L_s$ is preferably adjusted/selected to be very close to $3\lambda_g/2$, where $\lambda_g$ is the guided wavelength of the $TM_{01}$ cylindrical waveguide mode. In order to achieve $TEM_{001}$ excitation in the coaxial section, L2 is preferably adjusted/selected to approximately $\lambda_0/2$, where $\lambda_0$ is the free space wavelength. In general, $\lambda_0$ is based on the relationship $f\lambda_0$=c, where c is the speed of light (e.g., for excitation frequency f=2.45 GHz, $\lambda_0$=12.2 cm; for f=915 MHz, $\lambda_0$=32.8 cm). In practice, $\lambda_g$ is larger than $\lambda_0$ and can be computed as $\lambda_g=\lambda_0(1-(f_c/g)^2)^{-1/2}$, where $f_c$ is the cut-off frequency (and $f>f_c$). Suitable discharge ignition starting lengths for process development are when L1 and L2 are equal to each other and are equal to approximately $\lambda_0/2$. Then, ΔL is zero and the top of the substrate is substantially even with the $Z_0$ plane. Suitable starting lengths for the cylindrical section are $L_s$ of about $3\lambda_g/2$ and the coupling probe depth $L_p$ of about $\lambda_g/4$.

The geometry of the reactor 100 is generally a function of the geometric variables $L_s$, $L_p$, L1, L2, R1, R2, R3, and R4. When these geometric length variables are changed, the electromagnetic fields and the electromagnetic focus in the local region above and around the $Z_0$ plane are controlled and altered. Similarly, when a microwave discharge or plasma is present, the discharge power density, the plasma shape, and the plasma position can be altered by varying one or more of the geometric variables. Thus, a microwave plasma assisted deposition process (e.g., diamond synthesis) also can be changed, controlled, and optimized by changes in the reactor geometry.

When the size and shape of the reactor 100 is varied, for example by changing the various reactor radii or lengths, the reactor can be optimized for a specific deposition process. In practice R1 is determined primarily by the choice of the excitation frequency Generally, a range of R1 values can be used, ranging from a minimum R1 for the $TM_{013}$ mode to exist and some maximum R1 at which a distinct $TM_{013}$ mode is difficult to obtain due to many other modes having a similar $L_s$ value, and R2 and R3 are then determined by the specific process application (e.g., desired substrate size, operating pressure regime). For example, for low pressure, large-area operation and low discharge power density, R2 and R3 take on lengths that are slightly smaller than R1. Some reactor designs often fix the applicator radii, and then, during process optimization, the electromagnetic field patterns and associated microwave discharge are modified by varying L1, L2, $L_s$ and $L_p$ as well as pressure and input microwave power. This is a multivariable optimization procedure that is initially performed by the operator during process development and after some experience it can also be performed automatically via a preprogrammed recipe. Since there are many variables, there are many possible shapes, positions, and intensities that the discharge can assume in the vicinity of the $Z_0$ plane, and all of these are available for process optimization.

The reactor 100 in any of its embodiments can be operated in a process to deposit a component (e.g., single-crystal diamond, polycrystalline diamond) on the substrate 163A mounted or otherwise located above the coaxial stage 160 (e.g., on the substrate holder 163). The specific construction of the substrate 163A is not particularly limited and can be suitably selected based on the particular component being deposited. For example, single-crystal diamond can be deposited on a single-crystal seed substrate (e.g., high-pressure, high-temperature single-crystal seed), and polycrystalline diamond can be deposited on a silicon-based substrate (e.g., nucleation-seeded silicon, doped silicon, or silicon nitride). Polycrystalline diamond can include both nanocrystalline diamond (e.g., crystals on the order of nanometers to hundreds of nanometers) and microcrystalline diamond (e.g., crystals on the order of micrometers to hundreds of micrometers).

The reactor 100 is operated by applying power to the excitation probe 150 to generate electromagnetic waves at a selected frequency. For example, applied powers ranging from about 1 kW to about 10 kW (e.g., about 2 kW to about 3 kW or about 4 kW) are suitable for a 2.45 GHz frequency, and applied powers ranging from about 5 kW to about 30 kW are suitable for a 915 MHz frequency. Based on the reactor 100 geometry and depending on the particular selection of characteristic length scales, a first electromagnetic mode M1 (e.g., $TM_{013}$) can be excited in the cylindrical chamber 122 of the reactor 100 and a second electromagnetic mode M2 (e.g., $TEM_{001}$) can be excited in the coaxial chamber 166 of the reactor 100, thereby forming a hybrid electromagnetic mode M3 in the plasma chamber 20. This "hybrid mode" has field patterns that are predominantly $TM_{013}$ in the cylindrical chamber and $TEM_{001}$ in the coaxial chamber. The two electromagnetic field patterns interact at the discontinuous $z=Z_0$ boundary plane. The abrupt physical discontinuity at the $Z_0$ plane sets up local evanescent fields on either side of the plane and the total field in the vicinity of the deposition substrate 163A (i.e., the impressed electromagnetic field that creates and sustains the plasma) is the sum of the two modes M1 and M2 plus the induced evanescent field.

The impressed substrate field can be varied by spatially changing the evanescent field around the discontinuity plane by varying the various dimensions such as R1, R2, R3 L1, and L2, etc. Thus by changing these dimensions, the electromagnetic focus at the substrate is varied. For example if R3 is reduced and L1 and L2 are approximately equal to one half of the free space wave length, then the field at the end of the substrate holder will be intense and mainly perpendicular to the top of the substrate. If L1 and L2 are then varied slightly, the field then has additional inward or outward directed radial components, there by changing the total impressed field pattern. If R3 and R4 are large (i.e., with respect to R2) then the impressed field pattern is reduced, but is more uniform over a larger radius, there by producing a more uniform plasma and a more uniform deposition over the larger substrate area. Thus, it is clear that a large variety of impressed electromagnetic field patterns can be created in the vicinity of the substrate by adjusting the reactor dimensions. Given a specific microwave plasma assisted CVD application, the reactor dimensions and tuning can be adjusted to optimize a specific process.

A source gas is fed to the interior cavity 182 of the plasma chamber 20 at a selected operating pressure to form a plasma 184 when power is being applied. The particular operating pressure in the plasma chamber 20 can range between about 10 Torr and 760 Torr and can be suitably controlled by the vacuum pump 194 and/or by source gas flow rates. The operating pressure is desirably increased, however, to increase the deposition rate of the component on the substrate 163A. For example, operating pressures of at least about 100 Torr, 150 Torr, 180 Torr, 200 Torr, or 220 Torr and/or up to about 300 Torr, 350 Torr, 400 Torr, 500 Torr, or 760 Torr can be selected in various embodiments. More particularly, suitable pressures at a 915 MHz frequency can range from about 100 Torr to about 160 Torr (e.g., when the substrate 163A ranges from about 10 cm to about 14 cm in size/diameter) or from about 20 Torr to about 100 Torr (e.g., when the substrate 163A ranges from about 14 cm to about 20 cm in size/diameter). Suitable pressures at a 2.45 GHz frequency can range from about 50 Torr to about 150 Torr (e.g., when the substrate 163A ranges from about 6 cm to about 9 cm in size/diameter). Alternatively, pressures at a 2.45 GHz frequency can range from about 100 Torr to about 400 Torr, about 180 Torr to about 260 Torr, or about 220 Torr to about 260 Torr (e.g., when the substrate 163A is up to about 6 cm or up to about 3 cm in size/diameter).

The particular source gas(es) fed to the plasma chamber 20 will depend on the particular deposition component. For diamond deposition, a mixture of methane ($CH_4$) and hydrogen ($H_2$) is suitable. The feed composition is generally expressed as a mol. % (or vol. %) of methane relative to hydrogen. For example, feed compositions of at least about 1 mol. % $CH_4$, 2 mol. % $CH_4$, or 3 mol. % $CH_4$ and/or up to about 5 mol. % $CH_4$, 6 mol. % $CH_4$, 8 mol. % $CH_4$, or 10 mol. % $CH_4$ can be selected in various embodiments. In some embodiments, the source gas can further include nitrogen ($N_2$) to increase the diamond deposition rate. Suitable nitrogen feed concentrations can range from about 0.0005 mol. % N2 or 0.005 mol. % N2 to about 2 mol. % $N_2$ relative to the hydrogen feed. Other source gases may be incorporated as desired to add desired dopants, for example including diborane ($B_2H_6$; to form boron-doped diamond). In yet other embodiments, an inert carrier gas (e.g., argon) can form the bulk of the source gas with desired levels of methane, hydrogen, etc. added to the carrier gas.

The process further includes adjusting the axial position of the lower conducting short 170 and/or the coaxial stage 160 of the reactor 100 to selectively position the electromagnetic focus of the plasma 184 above the substrate 163A during operation. The axial position adjustments can be made prior to operation of the reactor 100. For example, the lower conducting short 170 and the coaxial stage 160 can be set to their desired axial positions after which the reactor 100 can be powered on to execute a brief ignition step and then to perform a continuous deposition process according to the foregoing parameters. Alternatively or additionally, the lower conducting short 170 and the coaxial stage 160 can be set to their desired axial positions during the operation of the reactor 100 (e.g., using the structure illustrated in FIG. 2A to adjust the lower conducting short 170 and the coaxial stage 160 without needing to disassemble or otherwise access the plasma chamber 20 and the vacuum chamber 30).

The axial position adjustments can form the basis for a more general reactor tuning process. Specifically, a plurality (e.g., two or more) of combinations of L1 and L2 can be selected to identify favorable/optimum deposition properties (e.g., power density, substrate temperature, deposition rate, deposition uniformity) at a selected set of other operating parameters (e.g., operating pressure, source gas composition, applied power, coaxial stage radius (or other geometric parameters)). For example: L1 is held constant and L2 is parametrically varied over a plurality of values, L2 is held constant and L1 is parametrically varied over a plurality of values, or L1 and L2 are both parametrically varied over a plurality of values. Such parametric variation can be expressed in terms of a plurality of $\Delta L$ values that are individually tested (e.g., a plurality of $\Delta L/L1$ or $\Delta L/L2$ values ranging from about −0.5 to about 0.5, about −0.2 to about 0.2, about −0.1 to about 0.1, or about −0.05 to about 0.05). The tuning process is completed by operating the reactor 100 at each of the plurality of L1 and L2 (or $\Delta L$) combinations and then measuring or otherwise characterizing one or more deposition properties resulting from each individual tuning selection. Deposition properties can be measured at each combination of L1 and L2, and a specific set of L1 and L2 values (or the tuned L1 and L2 values) can be selected as that which maximizes or otherwise optimizes the reactor operation in terms of one or more deposition properties. For example, it is generally desirable to maximize the power density and/or the deposition rate, and such maximization can be constrained by a desire to simultaneously maintain the substrate temperature and/or the deposition uniformity within or under a specific range based on safety and/or quality considerations.

While the tuning process generally applies to the selection of favorable/optimum geometric parameters for reactor operation, other operating conditions can be parametrically varied over a plurality of values in addition to the plurality of L1 and L2 values as part of the tuning process. For example, the operating pressure and/or the source gas composition can be varied to characterize their influence on one or more deposition properties.

The particular selection of geometric reactor parameters (e.g., coaxial stage 160 radius R3, coaxial stage 160 distance L1, lower conducting short 170 distance L2) permits operation of the reactor 100 under conditions that result in favorable/optimum properties of deposition process and/or resulting deposition film. Particular deposition properties of interest include applied power density, substrate temperature, deposition rate, and deposition uniformity. Thus, the reactor 100 is preferably capable of obtaining any combination of the foregoing deposition properties during operation, for example including deposition property values within the following ranges.

The power density (or discharge power density) is the absorbed microwave power divided by the plasma 184 volume. A relatively high power density is desirable as it generally leads to higher component deposition rates. In various embodiments, the power density is suitably at least about 50 W/cm$^3$, 100 W/cm$^3$, 120 W/cm$^3$, 160 W/cm$^3$, or 200 W/cm$^3$ and/or up to about 500 W/cm$^3$, 600 W/cm$^3$, 700 W/cm$^3$, 800 W/cm$^3$, 900 W/cm$^3$, 1000 W/cm$^3$, or 2000 W/cm$^3$.

During deposition, the temperature uniformity across the substrate 163A correlates with the size of the plasma 184. At low microwave powers, the plasma 184 may not completely cover the substrate 163A, leading to incomplete and/or non-uniform deposition. At higher microwave powers, the plasma 184 may expand in size to the point that it begins excessively heating the quartz bell jar 180. Thus, the substrate temperature uniformity and quartz bell jar temperature are preferably monitored and controlled during operation of the reactor 100 to achieve desired substrate temperature and substrate temperature uniformity without overheating the quartz bell jar (e.g., via the coolant 165A internal to the coaxial stage 160 and/or by adjusting the applied input power and/or operating pressure). For example, in a 2.45-GHz reactor and at elevated operating pressures of interest, the substrate temperature suitably ranges from about 1000° C. to about 1200° C., about 1050° C. to about 1200° C., or about 1100° C. to about 1200° C.

The deposition rate is suitably expressed as an integral property of the deposition process (i.e., total deposited (average) film thickness divided by the total deposition time, for example in microns per hour) and is desirably maximized to increase process throughput. In various embodiments, the deposition rate is suitably at least about 2 μm/h, 3 μm/h, 6 μm/h, 10 μm/h, 12 μm/h, or 15 μm/h and/or up to about 20 μm/h, 25 μm/h, 30 μm/h, 40 μm/h, 50 μm/h, 75 μm/h, 100 μm/h, or 150 μm/h (e.g., with the optional introduction of a nitrogen source gas) in particular for single crystal diamond and (microcrystalline) polycrystalline diamond. Deposition rates for nanocrystalline diamond are often lower, for example being at least about 50 nm/h or 100 nm/h and/or up to about 200 nm/h or 500 nm/h.

The deposition non-uniformity is desirably small so that the physical properties of the resulting film will be relatively homogeneous, regardless of how the resulting film is used in a practical setting. The deposition uniformity can be expressed as the percent relative deviation of the deposited component's film thickness measured at multiple (e.g., three or more) spatial locations (e.g., circumferential and/or radial locations) in the film. As reported herein, the deposition uniformity is the percent difference between the maximum and minimum measured thicknesses normalized to the average film thickness. In various embodiments, the deposition uniformity is suitably up to about 15%, 10%, 5%, or 3%. While the deposition uniformity is desirably as small as possible, process variability can result in deposition uniformities of at least about 0.1%, 0.2%, 0.5%, or 1%.

Additional details relating to the disclosed subject matter are described in the examples below. U.S. Pat. Nos. 8,316, 797, 8,668,962, U.S. Publication No. 2010/0034984, and International Publication No. WO 2012/173207 are incorporated herein by reference and they describe various suitable reactor geometries (e.g., microwave chambers with one or more cylindrical wall sections and/or variable-radius wall sections, axially adjustable conductive stages providing variable substrate positioning during deposition, axially adjustable upper microwave chamber boundaries and EM wave sources permitting internal cavity matching, reactor dimensions) and operating conditions (e.g., gas flow rates, feed gas compositions, microwave excitation frequencies, microwave excitation input powers, substrate temperatures, generated EM modes, operating pressures, reactor power densities, etc.).

EXAMPLES

The following examples illustrate the disclosed apparatus and methods, but are not intended to limit the scope of any claims thereto.

Example 1

This example illustrates the disclosed method for forming large area Single Crystal Diamond (SCD) surfaces based on the mosaic technique, where two separate seeds are grown together by Microwave Plasma Assisted Chemical Vapor Deposition (MPACVD). The approach was focused on reducing the lattice mismatch by sourcing both sides from a single High Pressure High Temperature (HPHT) commercial seed. Both seeds were crystallographically aligned based on a sequence of Polycrystalline Diamond (PCD) plates. Both sides are stitched together with a net increase in area produced by a continuous layer across the top surface given growth conditions selected to enhance lateral growth.

A reactor 100 as generally illustrated in FIG. 2A was used in this example, with the particular dimensions R1=8.9 cm, R2=7.0 cm, R3=1.9 cm, and R4=3.2 cm. A 2.45 GHz microwave power supply with phi symmetric cylindrical applicator creates an electromagnetic excitation region at the impedance matched cavity, including a hybrid electromagnetic (TM013/TEM001) excitation mode. The generated plasma discharge is formed just above the temperature-controlled substrate holder. MPACVD is performed under an atmosphere of 5% $CH_4/H_2$ at a pressure of 240 Torr. An incident power of about 1.8-3.0 kW generates a temperature of about 900-1100° C., producing homoepitaxial SCD growth over a standard 3.5 mm×3.5 mm×1.4 mm HPHT Diamond seed at a rate up to 32 µm/h. For the growth of SCD in a conventional molybdenum substrate holder with pocket recess to hold the seed, the pocket dimensions determine the quality of the grown layers.

Figure 3:
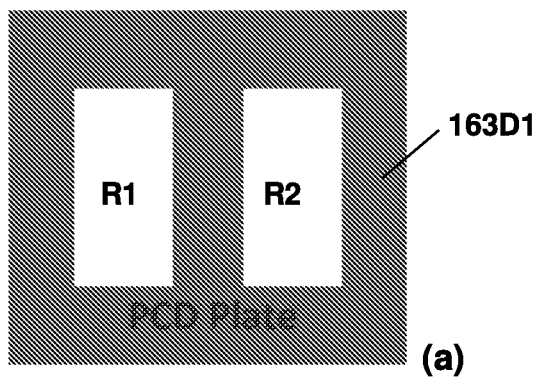
FIG. 3 illustrates the lateral SCD growth on the SCD substrates of Example 1, including (a) a top view of laser-cut PCD plate as the diamond substrate holder, (b) a perspective view of HPHT seeds and PCD plate diamond substrate holder in a surrounding molybdenum substrate holder, and (c) a qualitative side view of the growth process based on observed lateral growth.
Figure 3:
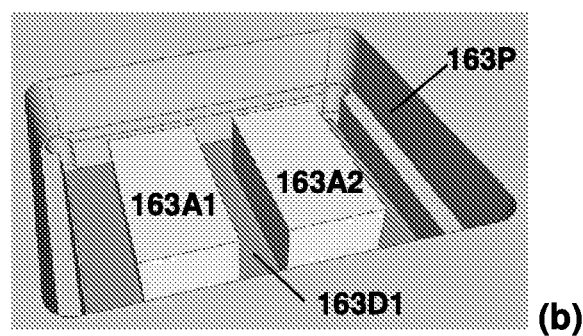
Figure 3:
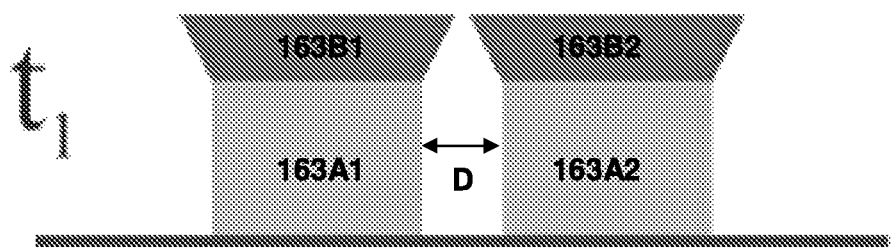
Figure 3:
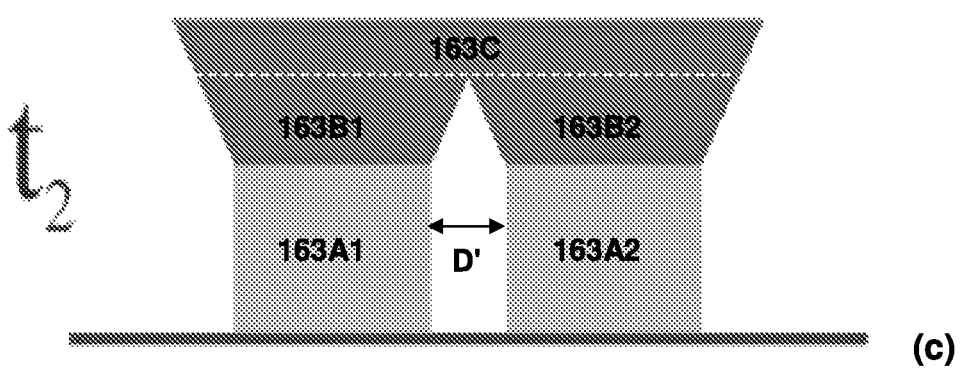

An HPHT diamond seed was laser cut in half along the (010) plane and placed on a custom PCD substrate holder 163D1 designed to favor lateral growth as shown in FIG. 3. The two halves had dimensions of 3.5 mm (L)×1.75 mm (W)×1.4 mm (H) and were used as SCD substrates 163A1 and 163A2. A 50 µm-thick PCD plate 163D1 (FIG. 3, panel a) was laser cut with a computer-controlled laser cutting system to provide cut-out sections R1, R2 sized to receive the SCD seed substrates 163A1 and 163A2 (i.e., 3.5 mm (L)×1.75 mm (W) cut-outs spaced apart by distance D) and hold both seeds in place. The cut-out sections R1, R2 had parallel edges to facilitate crystalline alignment in the eventual composite SCD layer, given that the SCD substrates 163A1 and 163A2 were cut from the same SCD seed and shared a crystallographically aligned bulk structure and crystallographically complementary sidewalls along their cutting plane. A second polished PCD plate 163D2 (FIGS. 1A-1C) was placed below the top PCD plate 163D1 to avoid slight misalignment due to milling grooves in the underlying molybdenum pocket holder holder 163P (FIGS. 1A-1C). In a first SCD growth step G1 (or "t1" as shown in FIG. 3, panel c), SCD layers 163B1 and 163B2 were deposited under the reactor conditions above and on the top growth surfaces of the SCD substrates 163A1 and 163A2, respectively.

The SCD deposition was paused at the end of the first SCD growth step G1, and the two diamond structures were removed from the reactor 100 for polishing: a first SCD substrate 163A1 and corresponding growth layer 163B1, and a second SCD substrate 163A2 and corresponding growth layer 163B2. After polishing (FIG. 4, panel a), the two diamond structures were placed back into the reactor 100 and into a newly cut PCD substrate holder 163D1, being pressed together. The bottom portions corresponding to the SCD substrates 163A1 and 163A2 were spaced apart by a new distance D' (e.g., slightly smaller than original separation distance D) based on the newly cut PCD substrate holder 163D1 plate with closer recesses R1, R2 also spaced apart by distance D', and the top surfaces of the growth layers 163B1 and 163B2 were essentially in contact at their upper lateral edges (e.g., with some regions of the edges being in direct contact, and other regions being up to about 50 µm to 100 µm apart), as shown in FIG. 4 (panel b).

Figure 4:
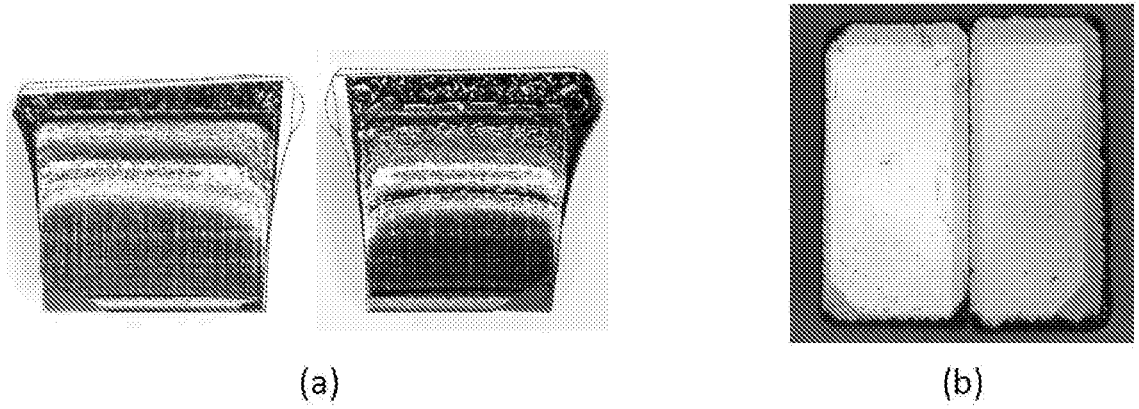
FIG. 4 includes photographic images illustrating the lateral and vertical SCD growth on the SCD substrates of Example 1 after a first growth and polishing step, including (a) a front view of both seeds after growth and polishing, and (b) a top view of both seeds after growth and polishing, which are then pressed together with a rectangular PCD plate at their base prior to a second growth step.
Figure 5:
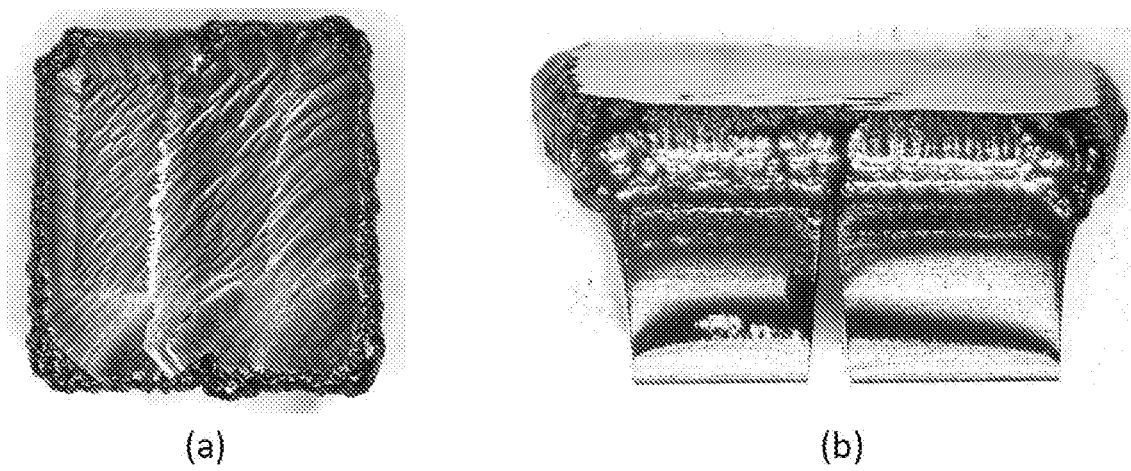
FIG. 5 includes photographic images illustrating the lateral and vertical SCD growth on the SCD substrates of Example 1 after second and subsequent growth steps, including (a) top view, (b) a side perspective view showing the smooth top surface of the composite SCD layer.

SCD deposition was resumed in second and subsequent growth stages G2-G4 such that the growth layers 163B1 and 163B2 continued to grow and join together to form composite SCD layer 163C as shown in FIG. 4 (panel c, "t2") and FIG. 5. As shown in FIG. 5, the additional growth stages produced a continuous layer across the entire composite SCD layer 163C surface. Although the top surface appears to be rough or wavy in the top view (FIG. 5, panel a), the side perspective view shows that the composite SCD layer 163C surface is smooth (FIG. 5, panel b).

Figure 6:
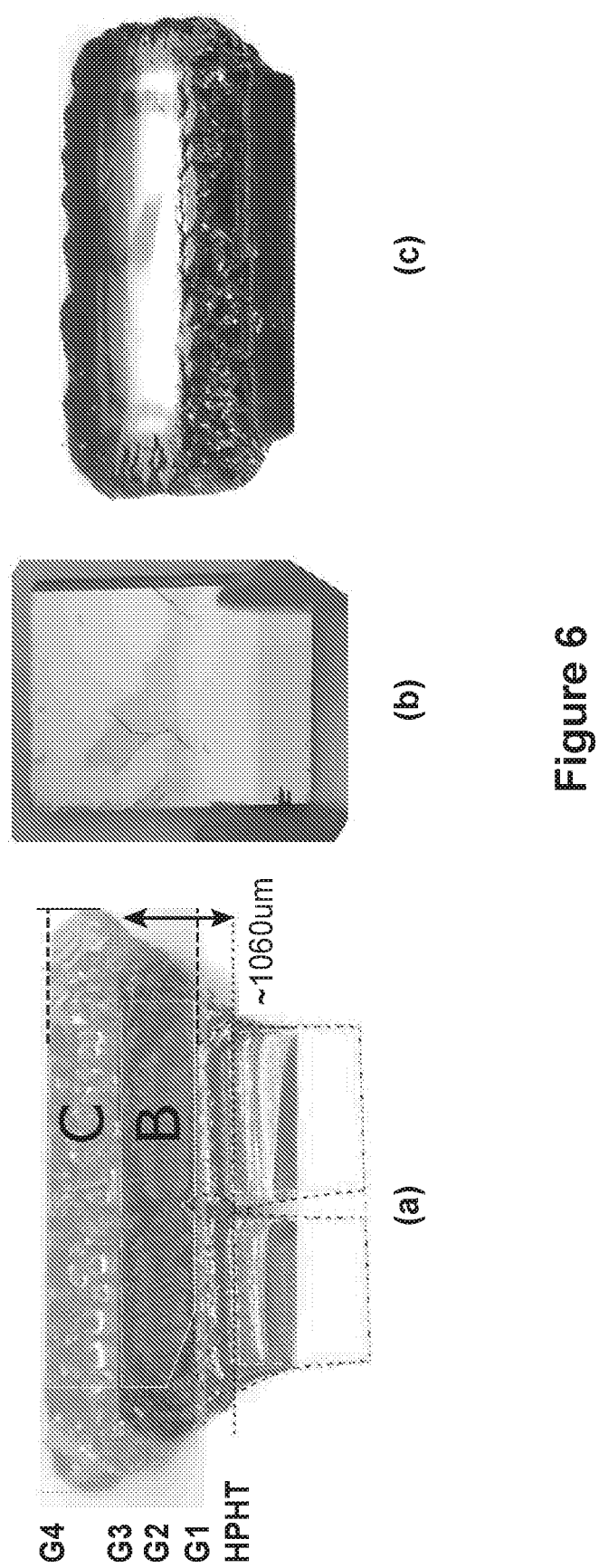
FIG. 6 includes photographic images illustrating the lateral and vertical SCD growth on the SCD substrates of Example 1 after four growth steps, including (a) a side view with overlays showing the heights of the of the original HPHT seeds and after each of the G1-G4 growth steps, (b) a top view of SCD plate B cut and polished from the composite growth structure resulting from growth steps G2 and G3, and (c) a side perspective of SCD plate C cut from the composite growth structure resulting from growth step G4 and showing the smooth top surface of the composite SCD layer.

The final SCD structure after four growth stages G1-G4 is shown as a side view in FIG. 6 (panel a). The final SCD structure was cut and polished to form SCD plate B (FIG. 6, panel b) and cut to form SCD plate C (FIG. 6, panel c) from the composite SCD layer 163C. The SCD plates B and C had increased surface areas for their large/primary faces relative to the combined area of the two original 3.5 mm (L)×1.75 mm (W) top growth surface areas for the SCD substrates 163A1 and 163A2.

Figure 7:
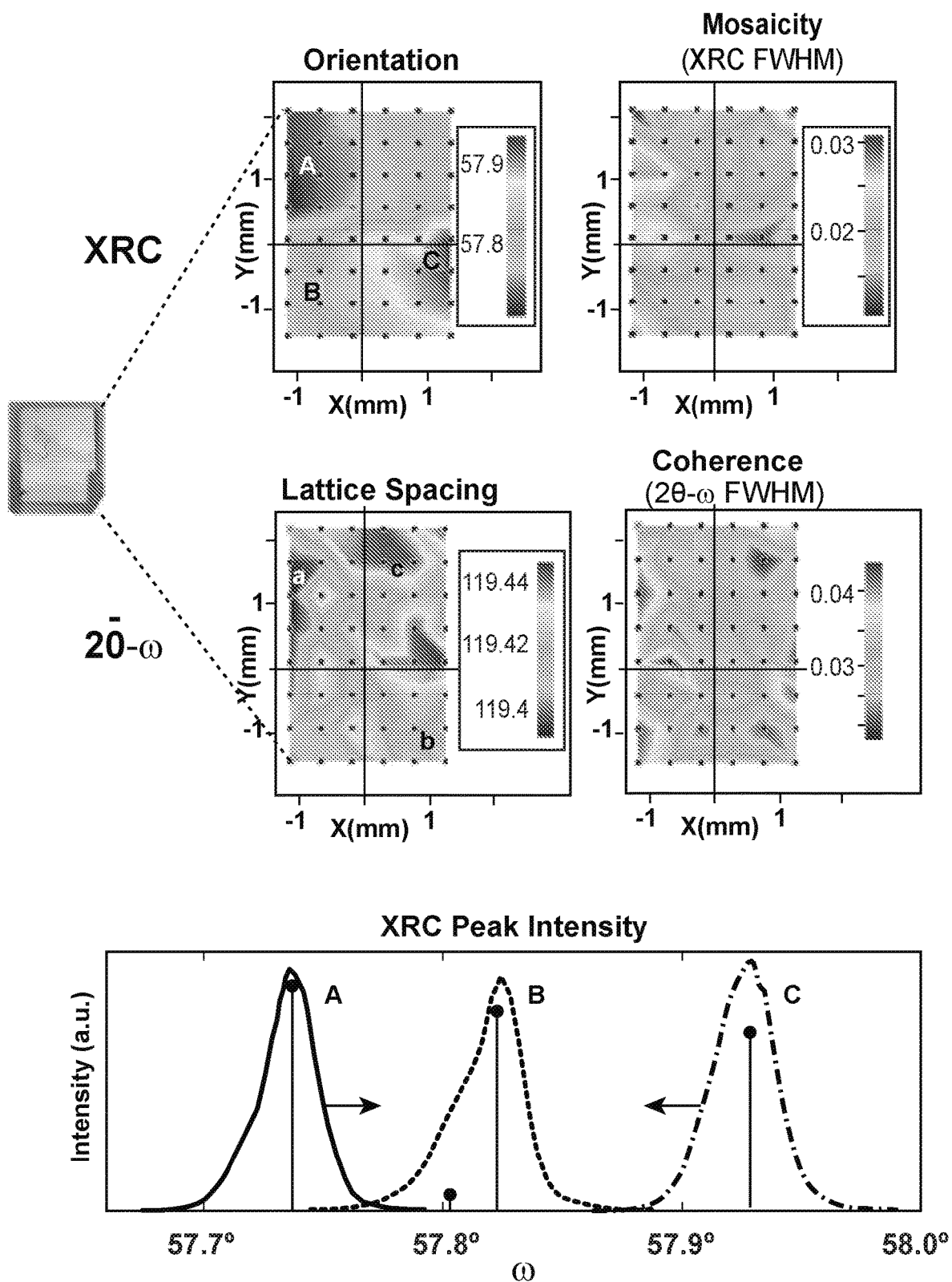
FIG. 7 includes contour plots of X-ray diffraction (XRD) data extracted from (400) peak locations and FWHM measurements from the top surface of SCD plate B at an array of XRD interrogation points, including orientation, mosaicity (XRC FWHM), lattice spacing, coherence (2θ-ω FWHM), and XRC peak intensity.

The top surface of SCD plate B was analyzed by x-ray diffraction (XRD). XRD data extracted from (400) peak locations and FWHM measurements were used to characterize the crystal structure of the SCD plate B, including orientation, mosaicity (XRC FWHM), lattice spacing, coherence (2θ-ω FWHM), and XRC peak intensity by Rocking Curve (XRC) and 2θ-ω techniques (FIG. 7). The orientation contour plot and corresponding XRC peak intensity plot indicate that the SCD plate B has a crystallographic alignment within about 0.2° for the entire surface/substrate. Specifically, local crystallographic orientation varied globally between about 57.74° (A) and 57.93° (C.) across the entire surface, with an average or median crystallographic orientation of about 57.82° (B), where (A), (B), and (C) correspond to the indicated spatial locations in the orientation plot and the indicated curves in the XRC peak intensity plot. The global difference between maximum and minimum values for the local crystallographic orientation angles can be used to represent a measure of crystallographic alignment for the SCD substrate as a whole, for example as determined by XRD analysis of the SCD substrate. In the XRD results of FIG. 7, the SCD substrate was interrogated via XRD at intervals of about 0.5 mm, approximately corresponding to the beam width of the XRD analysis system.

Figure 8:
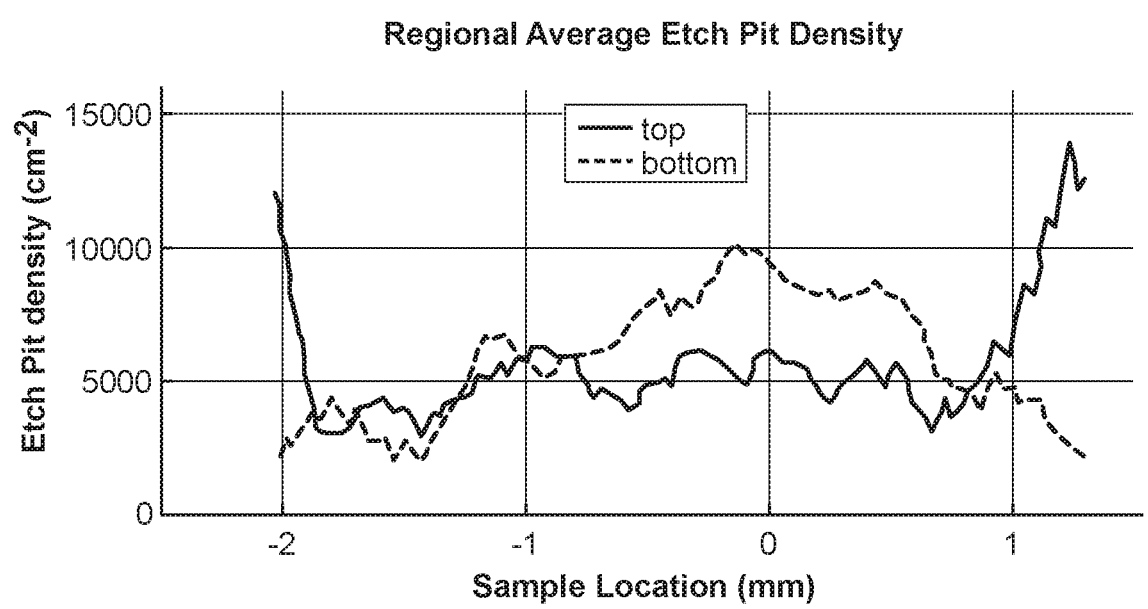
FIG. 8 is a graph illustrating less than 10,000 etch pits per square centimeter for top and bottom surfaces of SCD plate C in the joined region.

FIG. 8 is a graph illustrating less than 10,000 etch pits per square centimeter for top and bottom surfaces of SCD plate C in the joined region. Defects in the crystal lattice can be averaged by regions across the surface. A reduction in etch pit density can be observed near the interface when comparing different layers of the grown sample. Etch pit density is a measure of dislocation defects that intersect the surface. Typically the dislocation defects propagate along the direction of further growth. In this case, the defects are mostly in the vertical direction intersecting the top surface. A relatively low number of etch pits as shown for the top and bottom surfaces of SCD plate C (FIG. 8) indicates that the joint is more aligned and the diamond quality is higher.

This example illustrates that good SCD crystallographic alignment can be obtained in combination with an increased surface area for the growth surface based on low mosaicity, close orientation, and decreasing etch pit density along the interface where separate edges laterally grow and join together into the single composite SCD layer. Polishing and re-positioning of partially laterally grown SCD layers prior to the edges joining, was a helpful technique to improve composite SCD layer formation, in particular when the polished, partially grown SCD layers were re-positioned so that they were in contact or nearly in contact at their upper peripheral edges. This example demonstrates that the disclosed method is useful for forming large area SCD surfaces and substrate.

Lateral substrate expansion relies on the ability to have both vertical and lateral growth. In this example according to the disclosure, the lateral growth is a high quality single crystal diamond that is an extension of the base single crystal substrate from which it grows (i.e., the lateral growth diamond is part of the same single crystal as the substrate.) In other approaches to making large area substrates, poor quality lateral growth on a single crystal diamond substrate can result in polycrystalline diamond growth in a rim around the substrate's top surface. This type of polycrystalline growth can be avoided by the proper positioning of the substrate in the molybdenum substrate holder 163P. Important parameters for avoiding polycrystalline growth include the position of the top surface T of the growth surface (e.g., original seed substrate 163A1, growth layer 163B1, composite layer 163C) relative to the top surface T of the molybdenum holder 163P, and the lateral spacing between the substrate(s) and the (vertical) sidewall of the molybdenum holder 163P.

Because other modifications and changes varied to fit particular operating requirements and environments will be apparent to those skilled in the art, the disclosure is not considered limited to the example chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

All patents, patent applications, government publications, government regulations, and literature references cited in this specification are hereby incorporated herein by reference in their entirety. In case of conflict, the present description, including definitions, will control.

Throughout the specification, where the compositions, processes, kits, or apparatus are described as including components, steps, or materials, it is contemplated that the compositions, processes, or apparatus can also comprise, consist essentially of, or consist of, any combination of the recited components or materials, unless described otherwise. Component concentrations can be expressed in terms of weight concentrations, unless specifically indicated otherwise. Combinations of components are contemplated to include homogeneous and/or heterogeneous mixtures, as would be understood by a person of ordinary skill in the art in view of the foregoing disclosure.

What is claimed is:

1. A method for forming a large area single crystal diamond
   (SCD) surface, the method comprising:
   (a) providing a first SCD substrate having a growth surface;
   (b) providing a second SCD substrate having a growth surface, wherein
       (i) the second SCD substrate is spaced apart from and crystallographically aligned within 1° with the first SCD substrate, and
       (ii) the first SCD substrate and the second SCD substrate are spaced apart by a first distance of 0.5 mm to 5 mm;
   (c) depositing a first SCD layer on the first SCD growth surface and a second SCD layer on the second SCD growth surface for a first time period, the layers extending both vertically and laterally relative to their respective growth surfaces;
   (d) pausing deposition of the first SCD layer and the second SCD layer after the first time period, and then polishing (i) the first SCD layer to form a first polished SCD layer (ii) the second SCD layer to form a second polished SCD layer; and
   (e) continuing deposition of the first SCD layer on the first polished SCD layer and the second SCD layer on the second polished SCD layer for a second time period at least until they join together to form a composite SCD layer, wherein upper adjacent edges of the first polished SCD layer and the second polished SCD layer are within 100 µm;
   wherein providing the first SCD substrate and providing the second SCD substrate comprises:
       providing a diamond substrate holder comprising (i) a first recess sized and shaped to receive the first SCD substrate and (ii) a second recess sized and shaped to receive the second SCD substrate, wherein the first recess and the second recess are spaced apart and positioned relative to each other such that the first SCD substrate and the second SCD substrate are crystallographically aligned when placed in their respective recesses; and placing the first SCD substrate in the first recess such that the first SCD substrate growth surface is at or above a surrounding top surface of the diamond substrate holder; and placing the second SCD substrate in the second recess such that the second SCD substrate growth surface is at or above a surrounding top surface of the diamond substrate holder.

2. The method of claim 1, further comprising:
(f) cutting and optionally polishing the composite SCD layer to form a large area SCD substrate therefrom.

3. The method of claim 2, wherein the large area SCD substrate has a thickness in a range of 0.1 mm to 5 mm.

4. The method of claim 2, further comprising:
(g) cutting and optionally polishing the large area SCD substrate into a plurality of smaller SCD substrates each having a growth surface; and
(h) repeating steps (a)-(e) with at least two of the smaller SCD substrates as the first SCD substrate and the second SCD substrate.

5. The method of claim 1, wherein:
the diamond substrate holder is formed from SCD; and
the surrounding top surface of the diamond substrate holder further comprises a metal masking layer thereon.

6. The method of claim 1, wherein the diamond substrate holder is formed from polycrystalline diamond (PCD).

7. The method of claim 1, wherein:
the growth surface of the first SCD substrate is a (100) crystallographic surface; and
the growth surface of the second SCD substrate is a (100) crystallographic surface.

8. The method of claim 1, wherein the first SCD substrate and the second SCD substrate are spaced apart by a distance of 0.7 mm to 4 mm.

9. The method of claim 1, wherein:
the distance is a normal distance between an edge or sidewall of the first SCD substrate and a corresponding edge or sidewall of the second SCD substrate; and
the edge or sidewall of the first SCD substrate is crystallographically complementary to the corresponding edge or sidewall of the second SCD substrate.

10. The method of claim 9, wherein providing the first SCD substrate and providing a second SCD substrate comprises:
cutting a master SCD substrate along a cutting surface to form the first SCD substrate and the second SCD substrate as separate structures; and
aligning the first SCD substrate and the second SCD substrate such that the edge or sidewall of the first SCD substrate and the edge or sidewall of the second SCD substrate both correspond to the cutting surface from the master SCD substrate.

11. The method of claim 1, wherein the first SCD substrate and the second SCD substrate each independently have:
a growth surface area in a range of 1 mm$^2$ to 625 mm$^2$; and
a thickness in a range of 0.1 mm to 5 mm.

12. The method of claim 1, wherein depositing the first SCD layer and the second SCD layer comprises performing a chemical vapor deposition (CVD) process comprising operating a microwave plasma-assisted reactor in combination with a deposition source gas at a temperature and pressure sufficient to deposit the first SCD layer and the second SCD layer.

13. The method of claim 1, wherein the first SCD layer and the second SCD layer grow freely in an open growth volume and not in contact with a support surface.

14. The method of claim 1, wherein:
the first SCD layer and the second SCD layer have a vertical growth rate in a range of 1 µm/h to 100 µm/h;
the first SCD layer and the second SCD layer have a lateral growth rate in a range of 1 µm/h to 100 µm/h; and
the first SCD layer and the second SCD layer have a ratio of vertical growth rate:lateral growth rate in a range of 0.1 to 10.

15. The method of claim 1, wherein:
the composite SCD layer has a thickness in a range of 0.1 mm to 5 mm; and
the composite SCD layer has a top surface area that is at least 1.1 times the combined surface area of the first SCD substrate growth surface and the second SCD substrate growth surface.

16. The method of claim 1, wherein the composite SCD layer has a crystallographic alignment of 1° or less.

17. The method of claim 1, wherein crystallographic alignment is expressed as an angle between (i) a first direction that is a crystallographic direction in the first SCD substrate and (ii) a second direction that is the corresponding crystallographic direction in the second SCD substrate.

18. The method of claim 17, wherein the crystallographic direction is the direction.

19. The method of claim 1, wherein providing the first SCD substrate and providing the second SCD substrate further comprises:
providing a substrate holder having a top surface and defining a recess therein, wherein the diamond substrate holder is positioned in the substrate holder recess such that the substrate holder top surface is above each of (i) the first SCD substrate growth surface, (ii) the second SCD substrate growth surface, and (ii the surrounding top surface of the diamond substrate holder.

20. The method of claim 19, wherein:
the substrate holder is a metal substrate holder having one or more sidewalls defining the substrate holder recess; and
the first SCD substrate and the second SCD substrate are spaced apart from the one or more sidewalls of the metal substrate holder.

21. The method of claim 1, wherein the upper adjacent edges of the first polished SCD layer and the second polished SCD layer are within 50 µm.

22. The method of claim 1, wherein at least a portion of the upper adjacent edges of the first polished SCD layer and the second polished SCD layer are in contact with each other.

23. The method of claim 1, wherein, during step (e), the first SCD substrate and the second SCD substrate are spaced apart by a second distance of 0.5 mm to 5 mm.

24. The method of claim 23, wherein the second distance is less than the first distance.

25. The method of claim 1, wherein:
during step (e), the first SCD substrate and the second SCD substrate are spaced apart by a second distance; and
the second distance is less than the first distance.

26. The method of claim 1, wherein, during step (d):
deposition is paused before the first SCD layer and the second SCD layer join together; and
the first SCD layer and the second SCD layer are polished after removal from a deposition reactor.

27. A method for forming a large area single crystal diamond (SCD) surface, the method comprising:
(a) providing a first SCD substrate having a growth surface;
(b) providing a second SCD substrate having a growth surface, wherein
   (i) the second SCD substrate is spaced apart from and crystallographically aligned within 1° with the first SCD substrate, and
   (ii) the first SCD substrate and the second SCD substrate are spaced apart by a first distance of 0.5 mm to 5 mm;
(c) depositing a first SCD layer on the first SCD growth surface and a second SCD layer on the second SCD growth surface for a first time period, the layers extending both vertically and laterally relative to their respective growth surfaces;
(d) pausing deposition of the first SCD layer and the second SCD layer after the first time period, and then polishing (i) the first SCD layer to form a first polished SCD layer (ii) the second SCD layer to form a second polished SCD layer; and
(e) continuing deposition of the first SCD layer on the first polished SCD layer and the second SCD layer on the second polished SCD layer for a second time period at least until they join together to form a composite SCD layer, wherein upper adjacent edges of the first polished SCD layer and the second polished SCD layer are within 100 μm.

28. The method of claim 27, wherein:
during step (e), the first SCD substrate and the second SCD substrate are spaced apart by a second distance; and
the second distance is less than the first distance.

29. The method of claim 27, wherein, during step (d):
deposition is paused before the first SCD layer and the second SCD layer join together; and
the first SCD layer and the second SCD layer are polished after removal from a deposition reactor.

* * * * *